US012796442B2

(12) United States Patent
Yang et al.

(10) Patent No.: US 12,796,442 B2
(45) Date of Patent: Nov. 10, 2026

(54) INTEGRATION OF BIPOLAR DEVICE AND BACKSIDE POWER DELIVERY NETWORK

(71) Applicant: INTERNATIONAL BUSINESS MACHINES CORPORATION, Armonk, NY (US)

(72) Inventors: Xiaoming Yang, Clifton Park, NY (US); Tao Li, Slingerlands, NY (US); Ruilong Xie, Niskayuna, NY (US); Robert Gauthier, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 414 days.

(21) Appl. No.: 18/537,777

(22) Filed: Dec. 12, 2023

(65) Prior Publication Data

US 2025/0192049 A1 Jun. 12, 2025

(51) Int. Cl.

| | |
|---|---|
| ***H01L 23/528*** | (2006.01) |
| ***H10D 84/01*** | (2025.01) |
| ***H10D 84/03*** | (2025.01) |
| ***H10D 84/60*** | (2025.01) |
| ***H10D 84/80*** | (2025.01) |
| ***H10W 20/41*** | (2026.01) |

(52) U.S. Cl.

CPC ...... *H10W 20/427* (2026.01); *H10D 84/0109* (2025.01); *H10D 84/038* (2025.01); *H10D 84/60* (2025.01); *H10D 84/80* (2025.01)

(58) Field of Classification Search

CPC . H10W 20/427; H10D 84/80; H10D 84/0109; H10D 84/60; H10D 84/038

See application file for complete search history.

(56) References Cited

U.S. PATENT DOCUMENTS

| | | | | |
|---|---|---|---|---|
| 7,202,514 | B2 | 4/2007 | Ahmed | |
| 8,552,532 | B2 | 10/2013 | Clark, Jr. | |
| 10,090,200 | B2 | 10/2018 | Lian | |
| 2022/0102385 | A1* | 3/2022 | Guha | H10D 84/853 |
| 2022/0113199 | A1* | 4/2022 | Su | G01K 7/015 |
| 2022/0406715 | A1 | 12/2022 | Xie | |
| 2022/0415880 | A1* | 12/2022 | Kar | H10D 84/811 |
| 2023/0065318 | A1* | 3/2023 | Fan | H10D 64/01 |
| 2023/0207671 | A1 | 6/2023 | Su | |
| 2023/0268389 | A1* | 8/2023 | Jain | H10D 62/118 257/288 |
| 2023/0275084 | A1 | 8/2023 | Hong | |
| 2024/0105771 | A1* | 3/2024 | Guler | H10D 62/121 |
| 2024/0290850 | A1* | 8/2024 | Fan | H10D 30/6729 |
| 2024/0290860 | A1* | 8/2024 | Frougier | H10D 30/014 |
| 2024/0332282 | A1* | 10/2024 | Yu | H10D 89/711 |
| 2024/0429103 | A1* | 12/2024 | Li | H10D 84/038 |
| 2025/0063817 | A1* | 2/2025 | Zou | H10D 30/6735 |

OTHER PUBLICATIONS

Schmidt, C. et al., "Increasing breakdown voltage of p-channel LDMOS in BCD technology with novel backside process", In 2017 29th International Symposium on Power Semiconductor Devices and IC's (ISPSD), (2017), pp. 339-342.

* cited by examiner

*Primary Examiner* — William C Trapanese

(74) *Attorney, Agent, or Firm* — Scully, Scott, Murphy & Presser, P.C.; Samuel Waldbaum

(57) ABSTRACT

A semiconductor device includes a bipolar device and a logic device adjacent the bipolar device. A backside of the bipolar device is connected to a backside interconnect. A frontside of the bipolar device is connected to a back end of line (BEOL).

18 Claims, 18 Drawing Sheets

INTEGRATION OF BIPOLAR DEVICE AND BACKSIDE POWER DELIVERY NETWORK

BACKGROUND

Technical Field

The present disclosure generally relates to transistors, and more particularly, to the bipolar devices and backside power delivery networks, and methods of creation thereof.

Description of the Related Art

Bipolar junction transistors (BJTs) are semiconductor devices used in electronic circuits for various purposes, including amplification, switching, and signal processing. They usually come in two types: NPN (negative-positive-negative) and PNP (positive-negative-positive). Typically, BJTs include three layers of semiconductor material, namely the emitter, base, and collector. The flow of current between the emitter and collector is controlled by a small current applied to the base terminal. In some applications, NPN BJTs amplify current, while PNP BJTs amplify voltage. BJTs are known for their high gain and fast switching capabilities, making them salient components in various electronic applications, including amplifiers, digital logic gates, and oscillators.

SUMMARY

According to an embodiment, a semiconductor device includes a bipolar device, and a logic device adjacent the bipolar device. A frontside of the bipolar device is connected to a back end of line (BEOL), and a backside of the bipolar device is connected to a backside interconnect.

In some embodiments, which can be combined with the previous embodiment, the backside of the bipolar device is connected to the backside interconnect via a backside contact (BSCA) and a substrate.

In some embodiments, which can be combined with one or more previous embodiments, the frontside of the bipolar device is connected to the BEOL via a plurality of source/drain regions and a middle of line (MOL) contact.

In some embodiments, which can be combined with one or more previous embodiments, the bipolar device further comprises a substrate. The plurality of source/drain regions are P-doped, and the substrate is N-doped.

In some embodiments, which can be combined with one or more previous embodiments, the bipolar device further comprises a substrate. The plurality of source/drain regions are N-doped, and the substrate is P-doped.

In some embodiments, which can be combined with one or more previous embodiments, the semiconductor further includes a diffusion break between two adjacent source/drain regions. A bottom of the diffusion break is isolated from a substrate by a self-aligned substrate isolation (SASI).

In some embodiments, which can be combined with one or more previous embodiments, the semiconductor device includes a plurality of field-effect transistors (FETs).

In some embodiments, which can be combined with one or more previous embodiments, a first source/drain region in a first FET in the logic device is connected to the backside interconnect via the BSCA.

In some embodiments, which can be combined with one or more previous embodiments, the BSCA in the logic device includes a self-aligned portion and a non-self-aligned portion.

In some embodiments, which can be combined with one or more previous embodiments, the semiconductor further includes a layer of first inner spacer over portions of sidewalls of the self-aligned portion of the BSCA.

In some embodiments, which can be combined with one or more previous embodiments, a second source/drain region in a second FET in the logic device is connected to the BEOL via a MOL contact.

In some embodiments, which can be combined with one or more previous embodiments, the semiconductor device further includes a placeholder connected to the second source/drain region, and a layer of a second inner spacer over portions of sidewalls of the placeholder.

According to an embodiment, a method for forming a semiconductor device includes forming a bipolar device, providing a connection between a frontside of the bipolar device to a back end of line (BEOL), providing a connection between a backside of the bipolar device to a backside interconnect, and forming a logic device adjacent the bipolar device.

In some embodiments, which can be combined with the previous embodiment, the method includes providing a connection between the frontside of the bipolar device to the BEOL via a plurality of source/drain regions and a middle of line (MOL) contact.

In some embodiments, which can be combined with one or more previous embodiments, the method includes providing a connection between the backside of the bipolar device to the backside interconnect via a backside contact (BSCA) and a substrate.

In some embodiments, which can be combined with one or more previous embodiments, the method includes forming a diffusion break between two adjacent source/drain regions, and isolating a bottom of the diffusion break from the substrate by a self-aligned substrate isolation (SASI).

In some embodiments, which can be combined with one or more previous embodiments, the method includes providing a connection between a source/drain region in the logic device and the backside interconnect via the BSCA.

In some embodiments, which can be combined with one or more previous embodiments, the method includes forming a placeholder connected to a source/drain region, and forming a layer of inner spacer over portions of sidewalls of the placeholder.

In some embodiments, which can be combined with one or more previous embodiments, the method includes providing a connection between a source/drain region in the logic device and the BEOL via a MOL contact.

According to an embodiment, a semiconductor device includes a bipolar device, wherein a backside of the bipolar device is connected to a backside interconnect, a logic device adjacent the bipolar device, a backside contact (BSCA) in the logic device having a self-aligned section and a non-self-aligned section, and an inner spacer over sidewalls of the self-aligned section of the BSCA.

These and other features will become apparent from the following detailed description of illustrative embodiments thereof, which is to be read in connection with the accompanying drawings.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all the components or steps that are illustrated. When the same numeral appears in different drawings, it refers to the same or like components or steps.

DETAILED DESCRIPTION

Overview

Figure 1:
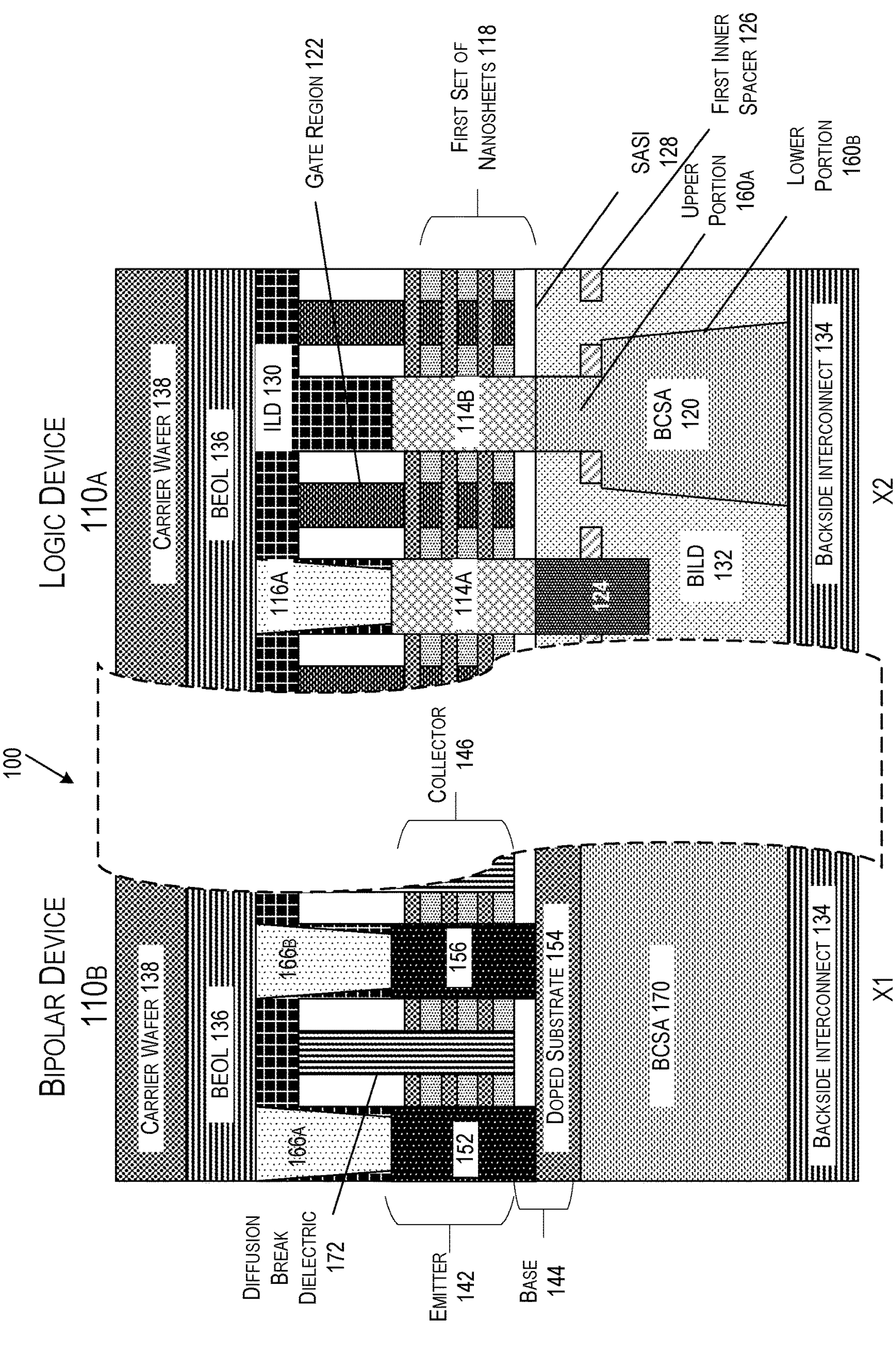
FIG. 1 illustrates a semiconductor device, in accordance with some embodiments.

In the following detailed description, numerous specific details are set forth by way of examples to provide a thorough understanding of the relevant teachings. However, it should be apparent that the present teachings may be practiced without such details. In other instances, well-known methods, procedures, components, and/or circuitry have been described at a relatively high-level, without detail, to avoid unnecessarily obscuring aspects of the present teachings.

In one aspect, spatially related terminology such as "front," "back," "top," "bottom," "beneath," "below," "lower," above," "upper," "side," "left," "right," and the like, is used with reference to the orientation of the Figures being described. Since components of embodiments of the disclosure can be positioned in a number of different orientations, the directional terminology is used for purposes of illustration and is in no way limiting. Thus, it will be understood that the spatially relative terminology is intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

As used herein, the terms "lateral" and "horizontal" describe an orientation parallel to a first surface of a chip.

As used herein, the term "vertical" describes an orientation that is arranged perpendicular to the first surface of a chip, chip carrier, or semiconductor body.

As used herein, the terms "coupled" and/or "electrically coupled" are not meant to mean that the elements must be directly coupled together-intervening elements may be provided between the "coupled" or "electrically coupled" elements. In contrast, if an element is referred to as being "directly connected" or "directly coupled" to another element, there are no intervening elements present. The term "electrically connected" refers to a low-ohmic electric connection between the elements electrically connected together.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

Example embodiments are described herein with reference to cross-sectional illustrations that are schematic illustrations of idealized or simplified embodiments (and intermediate structures). As such, variations from the shapes of the illustrations as a result, for example, of manufacturing techniques and/or tolerances, may be expected. Thus, the regions illustrated in the figures are schematic in nature and their shapes do not necessarily illustrate the actual shape of a region of a device and do not limit the scope.

It is to be understood that other embodiments may be used and structural or logical changes may be made without departing from the spirit and scope defined by the claims. The description of the embodiments is not limiting. In particular, elements of the embodiments described hereinafter may be combined with elements of different embodiments.

As used herein, certain terms are used indicating what may be considered an idealized behavior, such as, for example, "lossless," "superconductor," or "superconducting," which are intended to cover functionality that may not be exactly ideal but is within acceptable margins for a given application. For example, a certain level of loss or tolerance may be acceptable such that the resulting materials and structures may still be referred to by these "idealized" terms.

The concepts herein are related to bipolar junction transistors (BJTs), which are semiconductor devices that can be used in BiCMOS (Bipolar Complementary Metal-Oxide-Semiconductor) technology, where it coexists harmoniously with CMOS (Complementary Metal-Oxide-Semiconductor) logic gates within a single integrated circuit. BJTs are known for their high-speed operation, high gain, and low output impedance, and are typically used in analog and high-frequency applications where amplification and signal fidelity are critical. BJTs are often used for applications such as analog amplifiers and low-noise radio frequency (RF) circuits due to their fast switching characteristics. CMOS technology, on the other hand, is renowned for its low-power consumption, high input impedance, and suitability for digital logic circuits. CMOS is a salient component of the digital electronics, offering energy-efficient operation and the ability to construct large arrays of logic gates for digital signal processing.

In a BiCMOS chip, the two technologies are integrated in a complementary manner. This means that BJTs handle analog functions that involve high-speed, high-gain amplification, while CMOS components are used for digital logic, which benefits from low power consumption and compatibility with large-scale integration. BiCMOS technology is particularly valuable in mixed-signal applications, where both analog and digital circuitry coexist on the same chip. Examples of applications that benefit from BiCMOS technology include data converters (analog-to-digital and digital-to-analog converters), wireless communication systems, precision analog circuits, and high-performance microcontrollers.

As mentioned earlier, BJTs exhibit high-speed operation, providing rapid switching capabilities ideal for applications requiring quick signal amplification or modulation. Moreover, BJTs offer high voltage gain, making them valuable components in amplifiers where signal fidelity and precision are paramount. Their low output impedance ensures efficient power transfer, which is especially advantageous in scenarios demanding robust signal transmission. However, it is worth noting that BJTs tend to consume relatively more power per device compared to CMOS components.

In contrast, CMOS devices inherently boast high input impedance, which minimizes loading effects and enhances signal integrity. Additionally, CMOS is adept at constructing large arrays of low-power logic gates. This makes CMOS the technology of choice for designing energy-efficient digital circuits and processors. The combination of BJTs and CMOS in BiCMOS technology leverages the high-speed, high-gain, and low output impedance of BJTs while harnessing the high input impedance and low power consumption attributes of CMOS logic gates.

One key application domain where this synergy shines is in the realm of high-frequency analog amplification, particularly in the development of low-noise RF amplifiers, where the judicious use of BJTs within the BiCMOS framework allows designers to achieve the required signal amplification with precision and minimal noise interference. The employment of a select few active devices optimizes power consumption while still delivering high-performance RF amplification. This is a testament to the versatility and adaptability of BiCMOS technology in catering to the diverse demands of modern electronics, where high-frequency analog amplification meets low-power, high-density logic gate integration.

While backside power delivery network (BSPDN) formation, including schemes such as direct backside source/drain contact, offers advantages in certain semiconductor applications, integrating bipolar devices, such as BJTs, with logic circuits in this context presents numerous intricate challenges. These challenges encompass complexities associated with substrate removal, considerations related to thermal and mechanical effects, isolation and signal compatibility prerequisites, power supply management, and comprehensive testing and validation efforts. Addressing these challenges effectively is essential to achieving the successful integration of bipolar and CMOS devices in semiconductor fabrication.

In view of the foregoing, disclosed is a semiconductor device that integrates BJTs with direct backside contact and with accurate backside contact depth control. The disclosed semiconductor device enables PSPDN formation for a bipolar device, such as a BJT, which is cointegrated with a logic device.

Accordingly, the teachings herein provide methods and systems of semiconductor device formation with integrated BSPDN. The techniques described herein may be implemented in a number of ways. Example implementations are provided below with reference to the following figures.

Example Semiconductor Device with Integrated BSPDN Structure

Reference now is made to FIG. 1, which is a simplified cross-section view of a semiconductor device 100, consistent with an illustrative embodiment. The disclosed semiconductor device 100 can include a logic device 110A cointegrated with a bipolar device 110B. The logic device 110A can be a nanosheet FET and can include a first source/drain region 114A, a second source/drain region 114B, a first contact 116A, a first backside contact, BSCA, 120, and a first set of nanosheets 118. The logic device 110A further includes a gate region 122, a placeholder 124, a first inner spacer 126, a self-aligned substrate isolation, SASI, 128, a first interlayer dielectric, ILD, 130, and a bottom ILD, BILD, 132. The logic device 110A is connected to a backside interconnect 134 on a backside, and to a back end of line, BEOL, 136, and a carrier wafer 138 on a frontside.

The bipolar device 110B includes an emitter 142, a base 144, and a collector 146. In some embodiments, while the emitter 142 can be a third source/drain region 152, the collector can be a fourth source/drain region 156, and the base can be a doped substrate 154. The bipolar device 110B can further include a second contact 166A, a third contact 166B, a second backside contact, BSCA, 170, the SASI 128, and a diffusion break dielectric, 172. Similar to the logic device 110A, the bipolar device 110B is connected to the backside interconnect 134 on a backside, and to the BEOL 136 and the carrier wafer 138 on a frontside. The second contact 166A can include, or be resistively coupled to, an emitter electrode. The third contact 166B can include, or be resistively coupled to, a collector electrode.

Generally, the first source/drain region 114A, the second source/drain region 114B, the third source/drain region 152, and the fourth source/drain region 156 are salient components that play relevant roles in the semiconductor device's operation. In various embodiments, the first source/drain region 114A, the second source/drain region 114B, the third source/drain region 152, and the fourth source/drain region 156 are regions within the semiconductor material, e.g., the semiconductor device 100, where the current flows in and out of the semiconductor device 100. The source region is the region through which the majority of charge carriers (e.g., electrons or holes) enter the channel of the semiconductor device and is responsible for providing the current that flows through the semiconductor device. The source region is typically doped to have an excess of charge carriers, creating a region with high carrier concentration. This abundance of carriers allows for the efficient injection of electrons or holes into the channel when a voltage is applied.

The drain region, on the other hand, is the region where the majority of charge carriers exit the channel. The drain region receives the current from the channel and carries the charge away from the transistor. Similar to the source, the drain region is also doped to have a high carrier concentration. The doping profile in the drain region ensures that carriers can easily flow out of the channel and into the drain region.

In some embodiments, the first source/drain region 114A is connected to a frontside of the semiconductor device 100 via the first contact 116A. In some embodiments, a gate region is connected to the frontside of the semiconductor device 100 via the ILD 130. In an embodiment, the second source/drain region 114B is connected to the backside of the semiconductor device 100 via the BSCA 120.

The first contact 116A, located over the first source/drain region 114A, establishes a connection between the first source/drain region 114A and the BEOL 136. The first contact 116A ensures efficient electrical routing and connectivity within the semiconductor device 100. The fabrication of the first contact 116A can involve lithography and etching processes to define the contact area. The first contact 116A can be made using conductive materials such as a silicide liner, e.g., Ni, Ti, NiPt, an adhesion metal layer, e.g., TiN and conductive metal fill material, e.g., tungsten (W), Co, or Ru.

The first set of nanosheets 118 includes 3D structures where the channel region of the logic device 110A is surrounded by multiple stacked nanosheets. The first set of nanosheets 118 serve as the conducting channels within the logic device 110A, and the gate structure controls the flow of current through these sheets.

The BSCA 120 is a region on the backside of the semiconductor device 100 where electrical connections are made. By establishing the electrical contacts, the BSCA 120 ensures the proper functioning of the semiconductor device 100 and facilitates electrical signal transmission.

The BSCA 120 can serve as a thermal interface between the semiconductor device 100 and a heat sink or other cooling mechanisms. By establishing direct contact with the substrate, the BSCA 120 can conduct the heat away from the semiconductor device 100, and contribute to improved thermal dissipation. In some embodiments, the BSCA 120 can help mitigate parasitic effects, such as substrate coupling or substrate noise, from the semiconductor device 100. The BSCA 120 can allow for increased integration density in the semiconductor device 100. In an embodiment, the BSCA 120 connects, i.e., wires, the second source/drain region 114B to the backside interconnect 134.

In some embodiments, the BSCA 120 includes an upper section 160A and a lower section 160B. The upper section 160A is connected to the second source/drain region and is self-aligned with respect to the second source/drain region 114B. As such, the upper section 160A has a width that is substantially equal to the width of the second source/drain region 114B. The lower section 160B connects the upper section 160A to the backside interconnect 134, and is not self-aligned with the second source/drain region 114B. As such, the lower section 160B has a width that is larger than the width of the upper section 160A. In some embodiments, the inner spacer 126 touches, i.e., covers, parts of the upper section 160A, i.e., the self-aligned portion, of the BSCA 120. In some embodiments, the inner spacer 126 is formed over the upper surface of the lower section 160B of the BSCA 120.

In various embodiments, the gate region 122 serves as control elements that regulate the flow of current through the semiconductor device 100. The gate region 122 can comprise a conductive material. The gate region 122 can control the flow of electric current between the source and drain regions. In some embodiments, by applying a voltage to the gate, the channel region's conductivity is modulated, allowing the semiconductor device 100 to either allow or block the flow of current, which in turn enables the semiconductor device 100 to act as electronic switches or amplifiers. The gate voltage can determine whether the semiconductor device 100 is in an "on" or "off" state. When the gate voltage is below a certain threshold, the semiconductor device 100 is in the "off" state, and the current flow between the source and drain is effectively blocked. On the other hand, when the gate voltage exceeds the threshold, the semiconductor device 100 enters the "on" state, allowing current to flow through the channel region. In addition to acting as a switch, modulating the gate voltage can enable the gate region 122 to control the current flowing through the channel region, resulting in amplified output signals.

In an embodiment, the gate region 122 can enable the implementation of Boolean logic operations, such as AND, OR, and NOT, by controlling the flow of current based on the input voltages. Multiple semiconductor devices can be interconnected to form complex logic circuits, enabling the execution of various computational tasks in digital systems. In some embodiments, the gate region 122, along with other semiconductor device components, can facilitate the miniaturization and integration of electronic circuits. The ability to control the channel region's conductivity through the gate voltage allows for compact and highly efficient circuit designs.

In some embodiments, the placeholder 124 can be epitaxially grown. The use of the placeholder 124 can provide more flexibility in the fabrication process, allowing for the creation of complex geometries or the integration of different types of materials.

The first inner spacer 126 can be formed over portions of sidewalls of the placeholder 124 and the BSCA 120. To that end, the first inner spacer 126 is formed within the etch stop layer, which is shown as "etch stop layer 210" in FIG. 2. In some embodiments, the inner spacer 126 is formed over the sidewalls of the placeholder 124 and the sacrificial placeholder, which is later replaced by the BSCA 120. Once the etch stop layer is removed during the fabrication process, e.g., by a directional etching process in the logic device 110A, and the BSCA 120 is formed, the inner spacer 126 can cover portions of the sidewalls of the placeholder 124 and the BSCA 120.

The SASI 128 can be utilized to isolate the semiconductor structure from the substrate electrically, and provide isolation and reduce parasitic capacitance and leakage currents between the semiconductor device 100 and the substrate. The SASI 128 is a dielectric material that can help improve the semiconductor device 100 performance and reliability by minimizing undesirable effects such as substrate leakage and latch-up.

The ILD 130 can be a layer of insulating material to electrically isolate and provide mechanical support between different layers of conducting and active components. The ILD 130 can enable efficient signal transmission, reduce crosstalk, and ensure the proper functioning of the semiconductor device 100. In an embodiment, the ILD 130 can electrically isolate adjacent conducting layers or active components in the semiconductor device 100. By providing insulation between different layers, the ILD 130 can prevent electrical shorts, reduce (e.g., minimize) leakage current, and ensure that signals are directed only along the desired pathways. In some embodiments, the ILD 130 can help reduce parasitic capacitance between adjacent metal interconnects or active devices and provide mechanical support to the semiconductor device's structure.

The BILD 132 can be an insulating material or layer used to isolate and provide electrical insulation between the semiconductor device's active regions and the BSCA 120, and to prevent unwanted electrical contact between the active regions and the backside contact, ensuring the proper functioning and integrity of the semiconductor device 100. In various embodiments, the BILD 132 can function as a protective layer, shielding the active regions of the semiconductor device 100 from external contaminants, moisture, and mechanical stress. The BILD 132 can further help prevent physical damage, such as scratches or particle contamination, which could adversely affect semiconductor device performance. Additionally, the BILD 132 can function as a barrier against moisture ingress, which can cause corrosion and degradation of the semiconductor device's components. In some embodiments, the backside interconnect 134 is formed to cover the BSCA 120 and the BILD 132. The backside interconnect 134 can connect the semiconductor device 100 to other devices.

The BEOL 136 includes metal interconnects, e.g., wires and metal lines, and insulating layers that connect the various components of the semiconductor device 100 and enable them to function as a cohesive unit. In some embodiments, one or more source/drain regions in the logic device 110A, e.g., the first source/drain region 114A, is connected to the BEOL 136 via the first contact 116A. In such embodiments, the bottom of the source drain region, e.g., the first source/drain region 114A, is connected to the placeholder 124.

The emitter 142 can be heavily doped n-type or p-type, to provides excess carriers. In some embodiments, the emitter 142 can act as source of charge carriers that provide most of emitter-collector current. The base 144 can be lightly doped, compared to the emitter 142, with opposite type from the emitter 142. That is, if the emitter is p-type, then the base 144 is n-type, and vice versa. In an embodiment, the base 144 has a thin width which allows carriers from the emitter 142 to diffuse across the base 144 and reach the collector 146. In various embodiments, while the base-emitter junction is forward biased, the base-collector junction is reverse biased. The collector 146 is moderately doped, compared to the emitter 142 and the base 144, with the same type as the emitter 142, and can collect carrier majority from the emitter 142, causing the emitter-collector current.

As shown in FIG. 1, in embodiments where the emitter 142 is a third source/drain region 152, the collector 146 is a fourth source/drain region 156, and the base 144 is a doped substrate, the doped substrate 154 can be an N-well. In such embodiments, the substrate is doped with a dopant that is the opposite of the third source/drain region 152 and the fourth source/drain region 156.

The second contact 166A, located over the third source/drain region 152, establishes a connection between the third source/drain region 152 and the BEOL 136. The second contact 166A ensures efficient electrical routing and connectivity within the semiconductor device 100. The fabrication of the second contact 166A can involve lithography and etching processes to define the contact area. The second contact 166A can be made using conductive materials such as a silicide liner, e.g., Ni, Ti, NiPt, an adhesion metal layer, e.g., TiN and conductive metal fill material, e.g., tungsten (W), Co, or Ru.

Similarly, the third contact 166B, located over the fourth source/drain region 156, establishes a connection between the fourth source/drain region 156 and the BEOL 136. The third contact 166B ensures efficient electrical routing and connectivity within the semiconductor device 100. The fabrication of the third contact 166B can involve lithography and etching processes to define the contact area. The third contact 166B can be made using conductive materials such as a silicide liner, e.g., Ni, Ti, NiPt, an adhesion metal layer, e.g., TiN and conductive metal fill material, e.g., tungsten (W), Co, or Ru.

The BSCA 170 is a region on the backside of the bipolar device 110B where electrical connections are made. By establishing the electrical contacts, the BSCA 170 ensures the proper functioning of the bipolar device 110B and facilitates electrical signal transmission.

The BSCA 170 can serve as a thermal interface between the bipolar device 110B and a heat sink or other cooling mechanisms. By establishing direct contact with the substrate, the BSCA 170 can conduct the heat away from the bipolar device 110B, and contribute to improved thermal dissipation. In some embodiments, the BSCA 170 can help mitigate parasitic effects, such as substrate coupling or substrate noise, from the bipolar device 110B. In further embodiments, the BSCA 170 can allow for increased integration density in the bipolar device 110B.

The diffusion break dielectric 172 is an insulating layer that separates the third source/drain region 152 and the fourth source/drain region 156, and can be made from silicon dioxide or silicon nitride. The diffusion break dielectric 172 can reduce minority carrier injection and improve current gain.

In some embodiments, the bipolar device 110B is a bipolar junction transistor (BJTs), which can be used for amplification and switching. BJT is a three-layer semiconductor device that functions as an electronic switch or amplifier. While in some embodiments, the BJT is a Negative-Positive-Negative, NPN, device, in some embodiments, the BJT is a Positive-Negative-Positive, PNP, device. Each of the NPN and PNP can function as a switch, in which by controlling the current applied to the base terminal, they can control the larger current flowing from the collector to the emitter, effectively using the transistor as an electronic switch.

In some embodiments, the bipolar device 110B is used as an amplifier. In such embodiments, in the amplification mode (active region), a small input current or voltage is applied at the base terminal to control a larger current flow between the collector and emitter.

In some embodiments, the passive device's configuration is a common emitter (NPN) or common base (PNP) configuration. In such a configuration, the input is applied to the base terminal, and the output is taken from the collector terminal, which provides voltage gain. Alternatively, in some embodiments, the passive device's configuration is a common collector (NPN) or common emitter (PNP) configuration. In such a configuration, the input is applied to the base terminal, and the output is taken from the emitter terminal, which provides current gain and is sometimes called an emitter follower.

Example Processes for Bipolar Device with Integrated BSPDN

With the foregoing description of an example semiconductor device, it may be helpful to discuss an example process of manufacturing the same. To that end, FIGS. 2-15 illustrate various steps in the manufacture of a semiconductor device, consistent with illustrative embodiments. It is worth mentioning that the semiconductor device 100 depicted in FIG. 1 can be the same as the semiconductor device depicted in FIGS. 2-15. For ease of illustration, the fabrication operations depicted therein will be described in the context of forming stacked transistors.

Figure 2A:
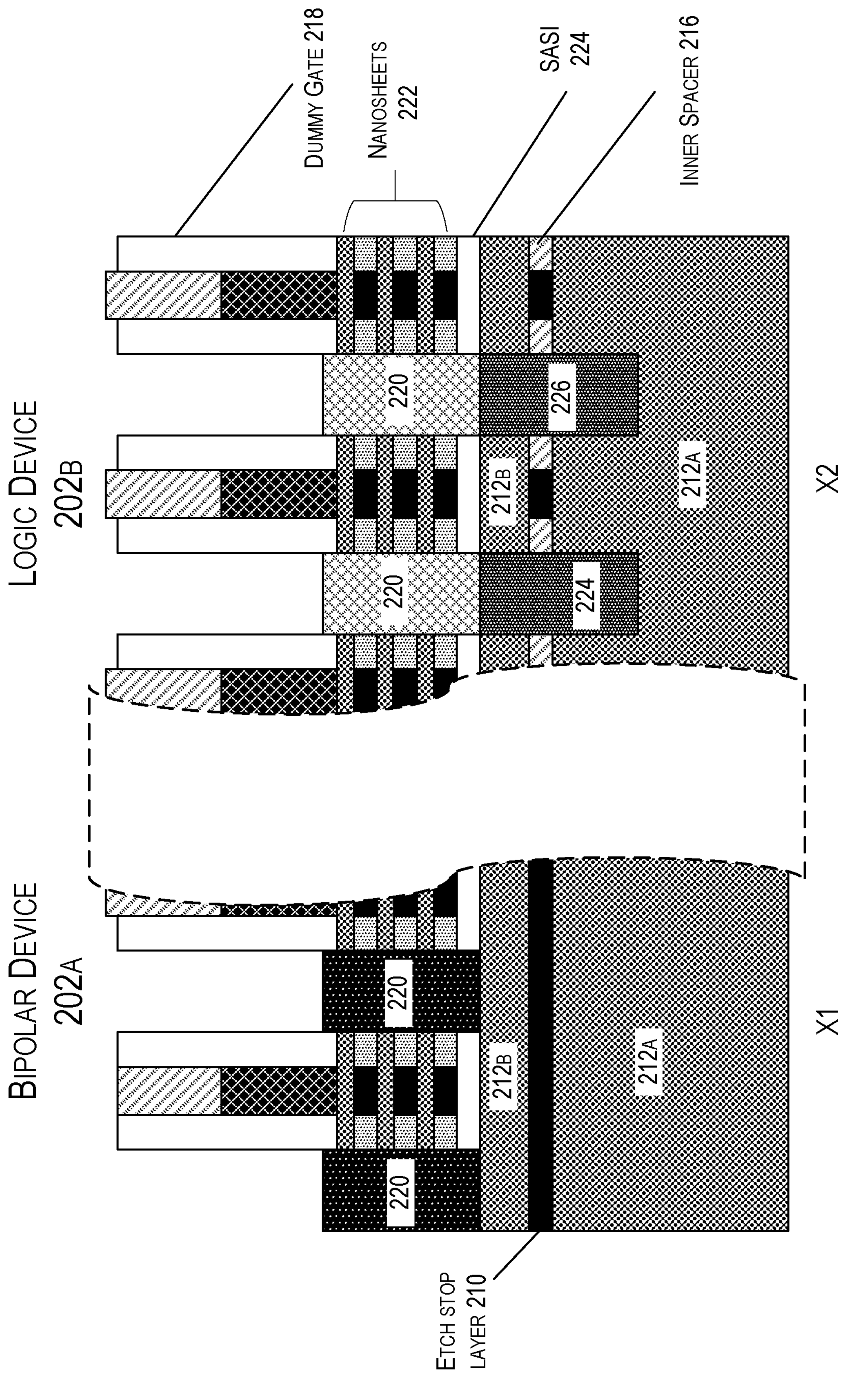
FIG. 2A illustrates the semiconductor device after the patterning of the active regions, in accordance with some embodiments.

Reference is now made to FIG. 2, which illustrates a semiconductor device after the active region and dummy gate patterning, and formation of the nanosheets and placeholders, in accordance with some embodiments. In some embodiments, an etch stop layer 210 is formed between the first substrate 212A and an N-well substrate 212B. In the illustrative example depicted in FIG. 2, the semiconductor device is depicted as being on silicon as the first substrate 212A and the N-well substrate 212B, while it will be understood that other types as substrates may be used as well, including, without limitation, monocrystalline Si, silicon germanium (SiGe), III-V compound semiconductor, II-VI compound semiconductor, or semiconductor-on-insulator (SOI). Group III-V compound semiconductors, for example, include materials having at least one group III element and at least one group V element, such as one or more of aluminum gallium arsenide (AlGaAs), aluminum gallium nitride (AlGaN), aluminum arsenide (AlAs), aluminum indium arsenide (AlIAs), aluminum nitride (AlN), gallium antimonide (GaSb), gallium aluminum antimonide (GaAlSb), gallium arsenide (GaAs), gallium arsenide antimonide (GaAsSb), gallium nitride (GaN), indium antimonide (InSb), indium arsenide (InAs), indium gallium arsenide (InGaAs), indium gallium arsenide phosphide (InGaAsP), indium gallium nitride (InGaN), indium nitride (InN), indium phosphide (InP) and alloy combinations including at least one of the foregoing materials. The alloy combinations can include binary (two elements, e.g., gallium (III) arsenide (GaAs)), ternary (three elements, e.g., InGaAs), and quaternary (four elements, e.g., aluminum gallium indium phosphide (AlInGaP)) alloys.

In various embodiments, the first substrate 210A may include any suitable material or combination of materials, such as doped or undoped silicon, glass, dielectrics, etc. For example, the substrate may include a silicon-on-insulator (SOI) structure, e.g., with a buried insulator layer, or a bulk material substrate, e.g., with appropriately doped regions, typically referred to as wells. In another embodiment, the substrate may be silicon with silicon oxide, nitride, or any other insulating film on top.

In various embodiments, the etch stop layer 210 is formed over the first substrate 212A. The etch stop layer 210 can be a thin layer of material incorporated into the structure of the semiconductor device to provide a selective barrier against etching processes, preventing further removal of underlying materials during fabrication. The etch stop layer 210 can enable precise control over the etching depth and help define the desired device dimensions. The etch stop layer 210 can further provide a stopping point for the etching process, ensuring that specific layers or regions are not etched beyond a certain point, leading to accurate patterning and control of critical features. The etch stop layer 210 can create a distinct separation between different layers or components within the device structure, and prevent the undesired etching of underlying layers or materials, enabling the creation of complex, multi-layered structures with well-defined interfaces and boundaries. In some embodiments, the etch stop layer 210 acts as a protective barrier for sensitive or delicate materials to shield such materials from aggressive etchants, preventing damage or degradation during subsequent fabrication steps.

In some embodiments, prior to forming the etch stop layer 210, the first substrate 212A is prepared by cleaning and removing any impurities or oxide layers. The etch stop layer 210 is deposited onto the first substrate 212A using techniques such as chemical vapor deposition (CVD), physical vapor deposition (PVD), or atomic layer deposition (ALD). In an embodiment, a photoresist can be applied, exposed to a patterned mask, developed, and used as a protective layer to define the etch stop regions. The etch stop layer 210 can then be selectively etched, stopping at a predetermined depth, while protecting the underlying layers. After the etching process, the remaining photoresist can be removed through stripping techniques. While in some embodiments, SiGe is used to form the etch stop layer 210, in some embodiments, silicon nitride (SiN), silicon oxide ($SiO_2$), or silicon oxynitride (SiON) can be used as the etch stop layer 210. In some embodiments, a second substrate, substrate 212B, is epitaxially grown over the etch stop layer 210. The substrate 212B can be an N-well substrate.

The inner pacer 216 is formed over the sidewalls of the placeholder 224 and the sacrificial placeholder 226 in the logic device 202B. The placeholder 224 and the sacrificial placeholder 226 can be made of Sic or epitaxially grown <100> SiGe. In some embodiments, a dummy gate 218 is formed over the logic device 202B and the bipolar device 202A. One or more source/drain regions 220 are epitaxially formed between the nanosheets 222, which are formed by recessing alternating layers of Si and SiGe. The SASI 238 is formed over the second substrate 210B and isolates the N-well substrate from damage during various fabrication acts.

Figure 2B:
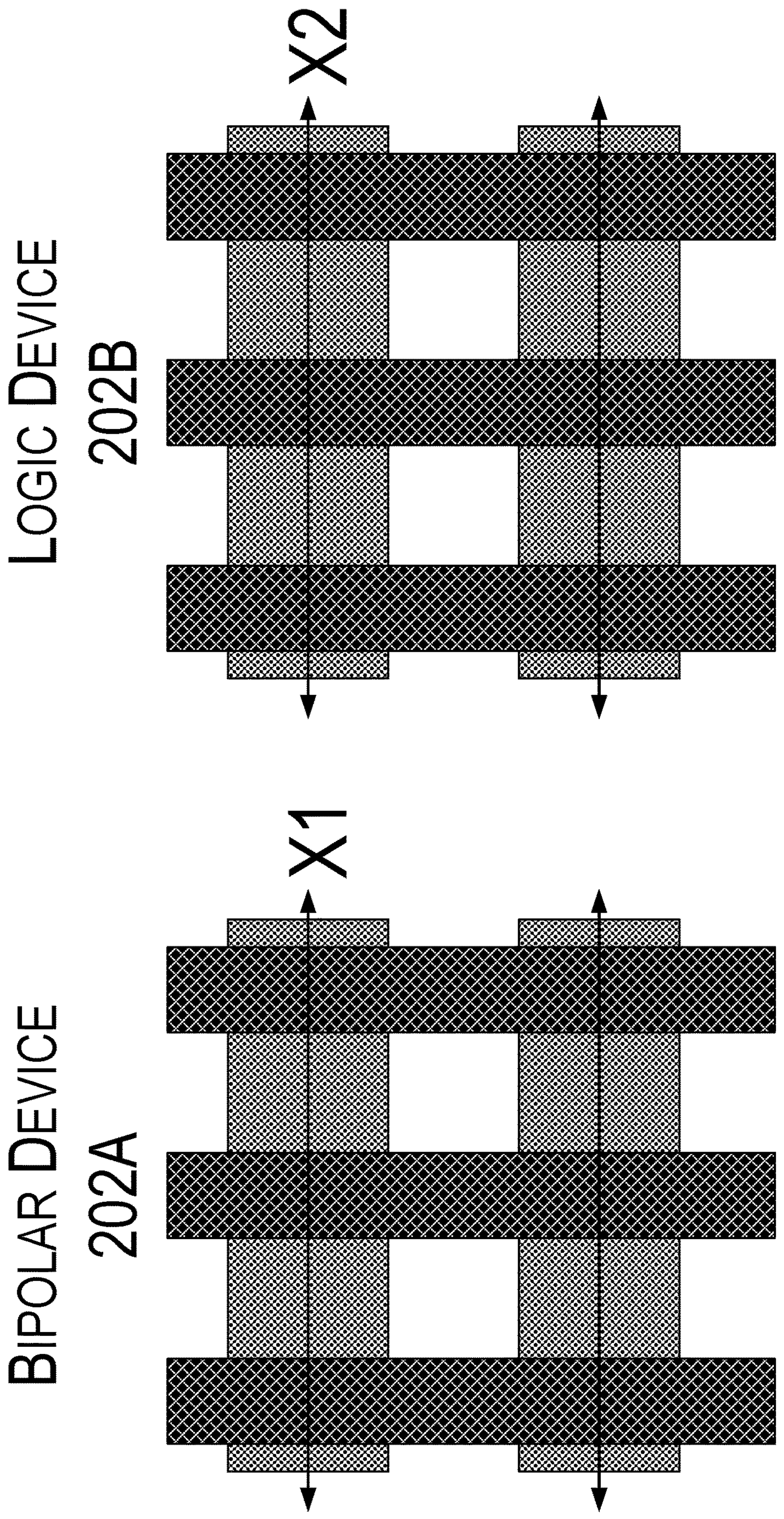
FIG. 2B illustrates top views of a bipolar device and a logic device, respectively, in accordance with some embodiments.

FIG. 2B depicts each section from which the semiconductor is shown. For example, portions of each figure denoting as X1 illustrate an X1 section of the semiconductor, and portions of each figure denoting as X2 illustrate an X2 section of the semiconductor device.

Figure 3:
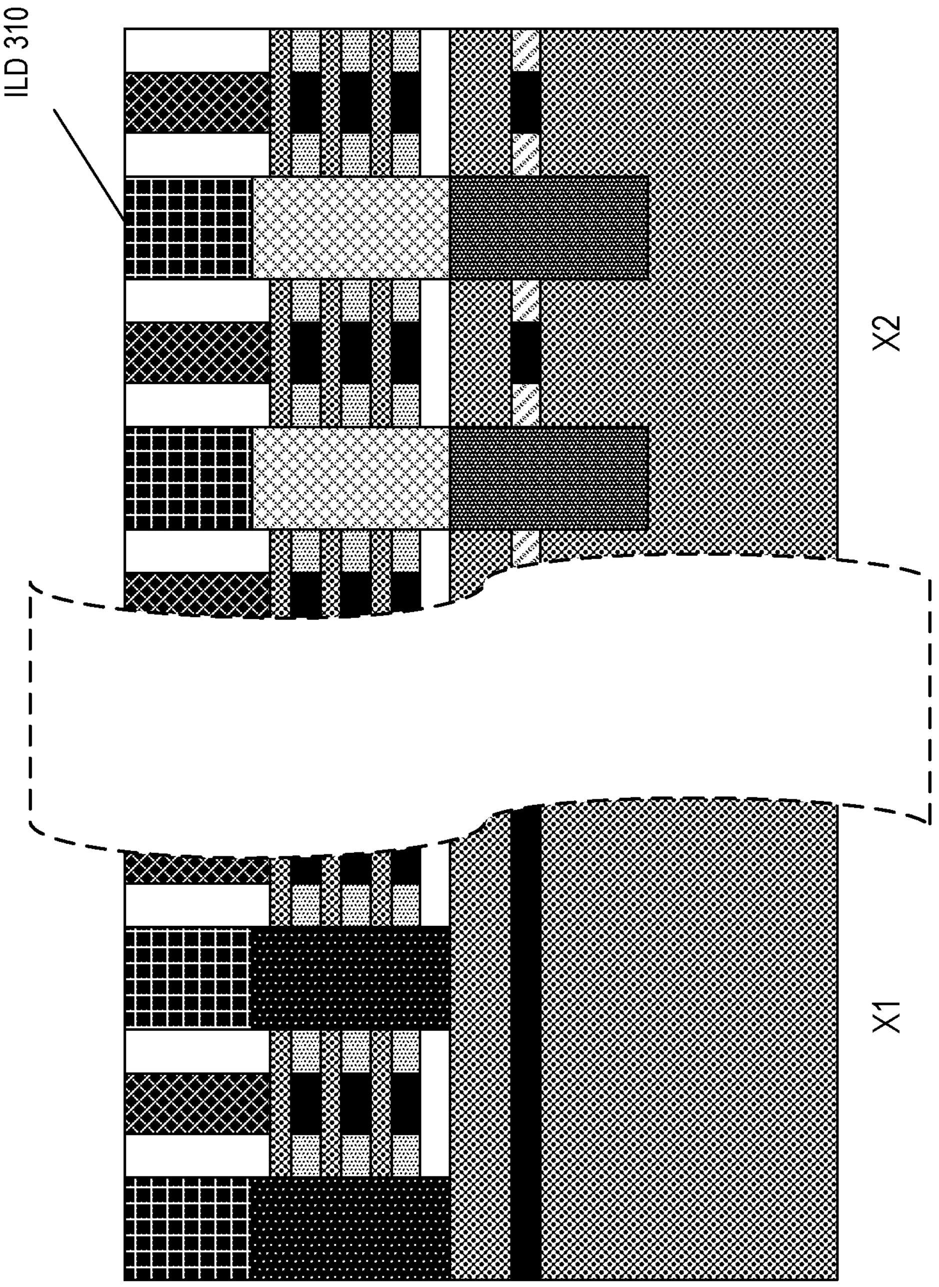
FIG. 3 illustrates the semiconductor device after the ILD filling, in accordance with some embodiments.

FIG. 3 illustrates a cross section view of a bipolar device 302A and a logic device 302B on a common wafer after the ILD filling, in accordance with some embodiments. In some embodiments, the ILD 310 is formed over the bipolar device 302A and the logic device 302B.

Figure 4:
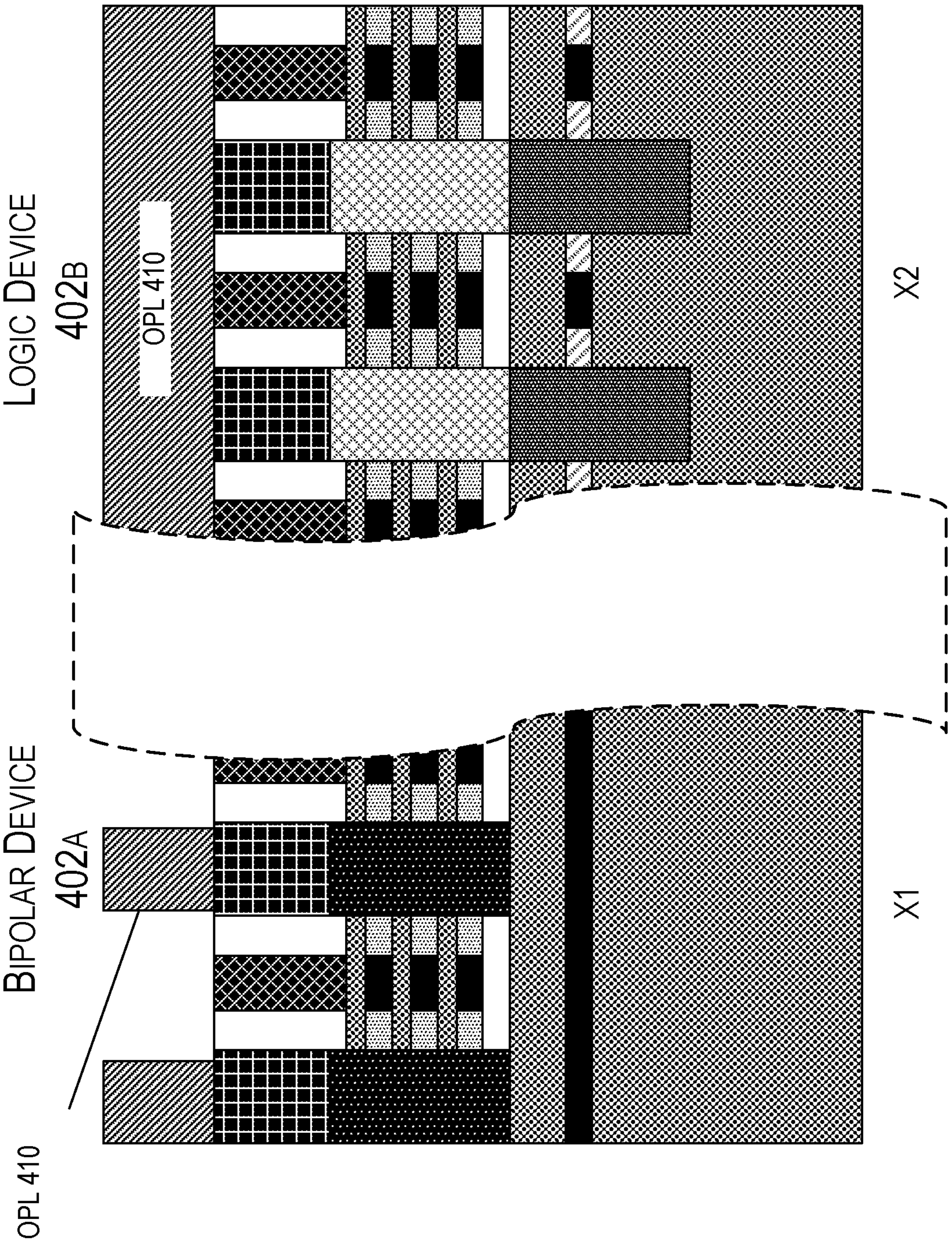
FIG. 4 illustrates the semiconductor device after the patterning of the diffusion break dielectric, in accordance with some embodiments.

FIG. 4 illustrates a cross section view of a bipolar device 402A and a logic device 402B on a common wafer after the patterning of the diffusion break dielectric, in accordance with some embodiments. In some embodiments, an organic planarization layer, OPL 410, is formed over the semiconductor device. The OPL 410 can include a photo-sensitive organic polymer having a light-sensitive material that, when exposed to electromagnetic radiation, is chemically altered and thus configured to be removed using a developing solvent. For example, in some embodiments, the photo-sensitive organic polymer can be polyacrylate resin, epoxy resin, phenol resin, polyamide resin, polyimide resin, unsaturated polyester resin, polyphenylene ether resin, polyphenylene sulfide resin, or benzo-cyclobutene (BCB). In some embodiments, the OPL 410 can include any organic polymer and a photoactive compound having a molecular structure that can attach to the molecular structure of the organic polymer. In some embodiments, the OPL 410 material is selected to be compatible with an overlying antireflective coating (not shown) and/or an overlying photoresist (not shown). In some embodiments, the OPL 410 can be applied using spin coating technology, although other techniques are within the contemplated scope of the present disclosure. Once the OPL 410 is formed, the logic device 402B is blocked and portions of the OPL 410 over the bipolar device 402A are patterned to open all dummy gates.

Figure 5:
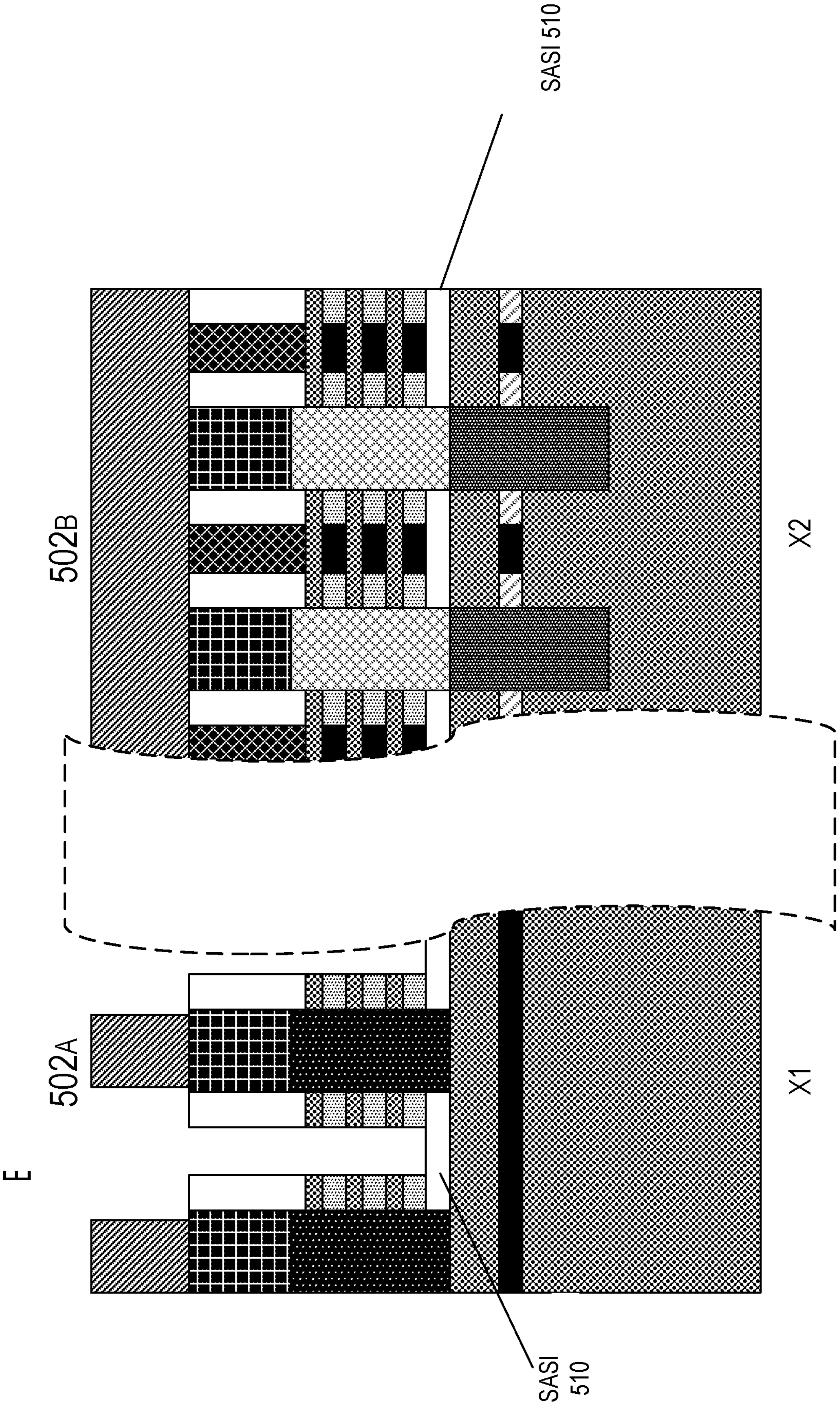
FIG. 5 illustrates the semiconductor device after the recession of the diffusion break dielectric, in accordance with some embodiments.

FIG. 5 illustrates a cross section view of a bipolar device 502A and a logic device 502B on a common wafer after the recession of the diffusion break dielectric, in accordance with some embodiments. In some embodiments, portions of the bipolar device 502A between the two source/drain regions are recessed until reaching the SASI 510. SASI 510 can serve as etch stop layer to prevent the N-well substrate from damage. A such, the thickness of the N-well substrate is controlled.

Figure 6:
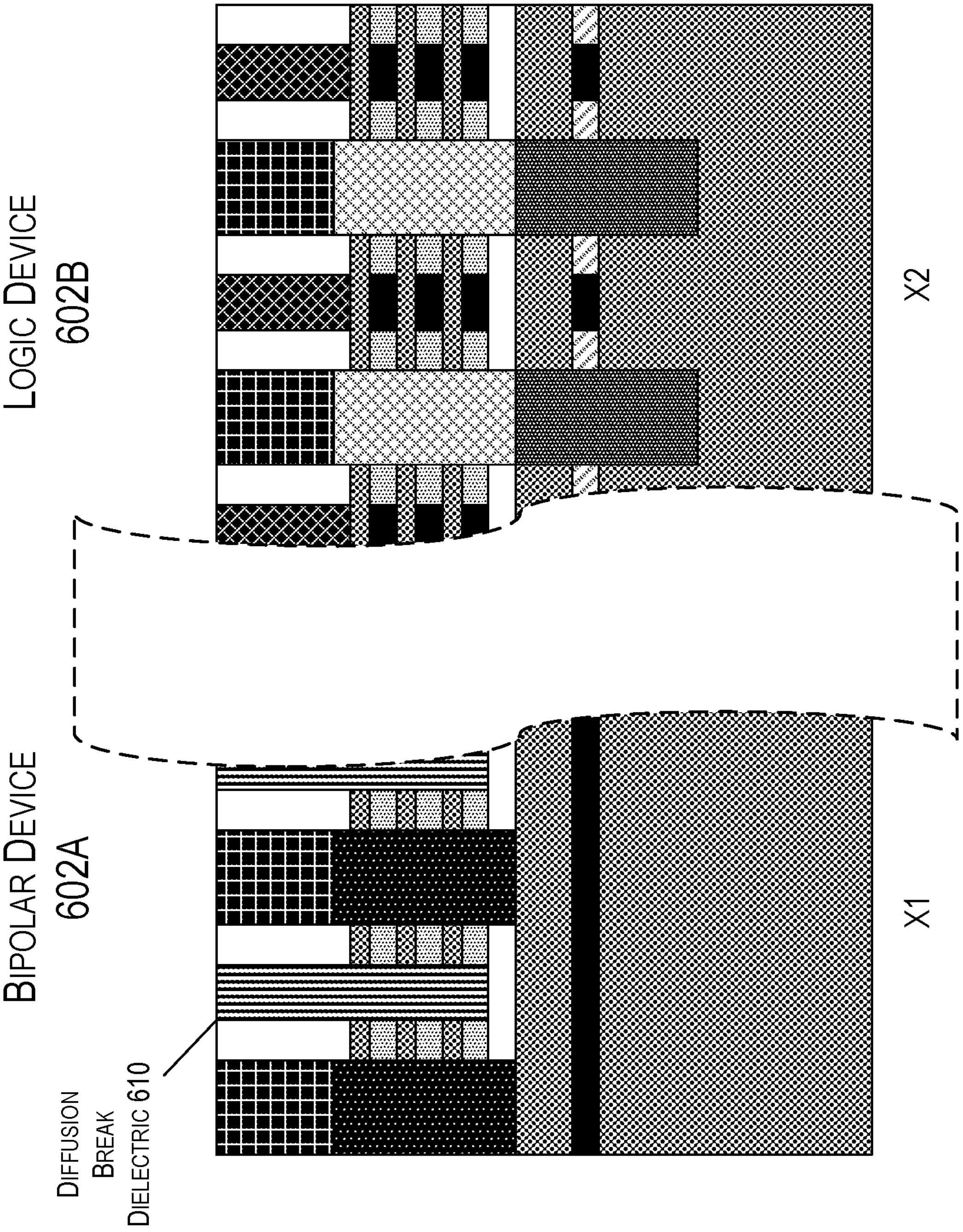
FIG. 6 illustrates the semiconductor device after the formation of the diffusion break dielectric, in accordance with some embodiments.

FIG. 6 illustrates a cross section view of a bipolar device 602A and a logic device 602B on a common wafer after the formation of the diffusion break dielectric, in accordance with some embodiments. In some embodiments, the remaining OPL is removed by ashing, which is a selectively eliminating the photoresist mask process after lithography while leaving the patterned features intact and undamaged on the wafer surface. Upon removal of the OPL, the diffusion break dielectric 610 is formed by filling the recess by a suitable material. A chemical-mechanical polishing (CMP) process can be performed afterwards.

Figure 7:
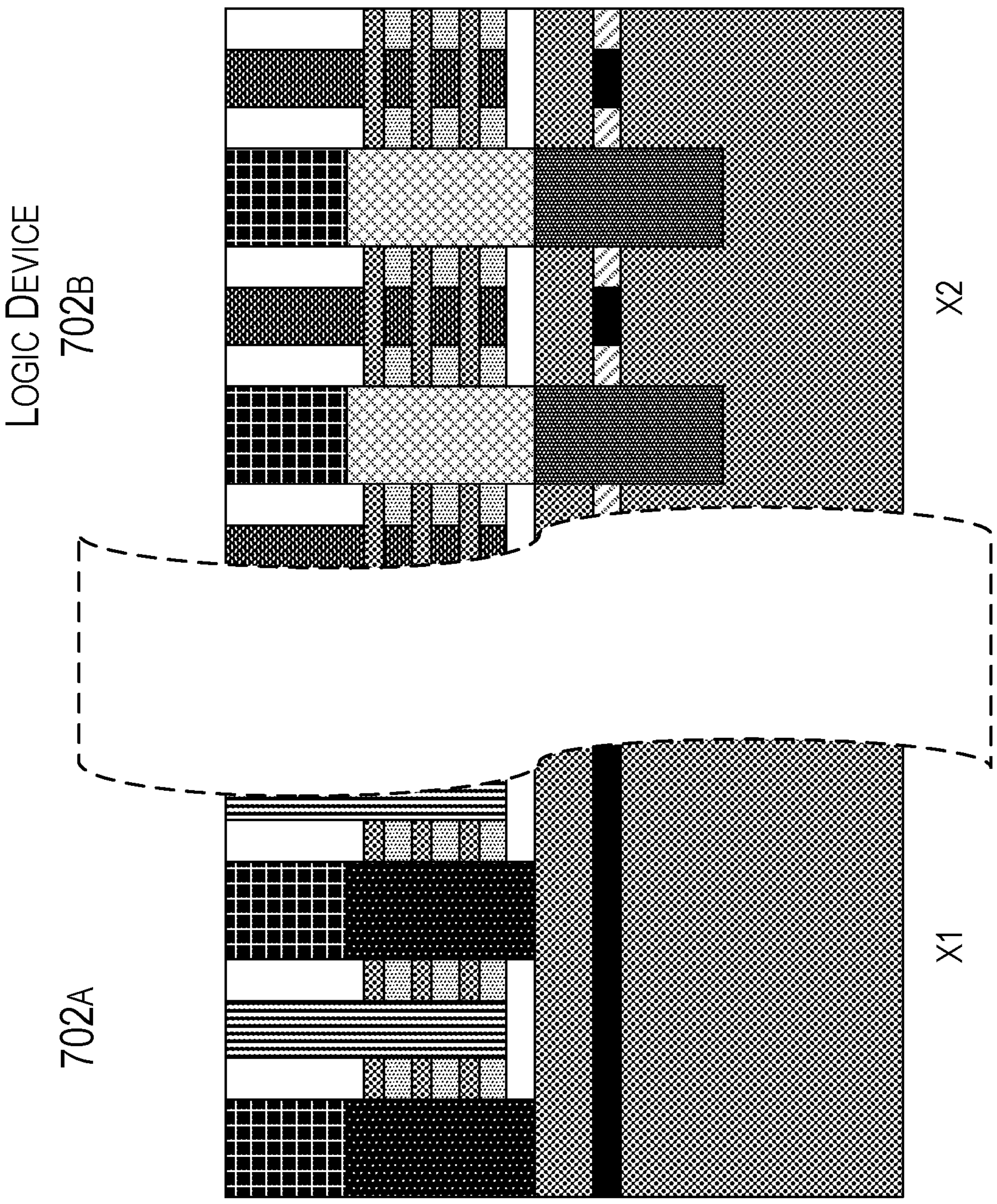
FIG. 7 illustrates the semiconductor device after the removal of the dummy gate, in accordance with some embodiments.

FIG. 7 illustrates a cross section view of a bipolar device 702A and a logic device 702B on a common wafer after the removal of the dummy gate, in accordance with some embodiments. In some embodiments, the dummy gate is removed and the SiGe layer is released. Gate cut regions can be formed and a replacement metal gate (RMG) process is performed to fabricate metal gate electrodes, form the contact for source/drain, and gate contact, and form the metal gate regions in the logic device. In some embodiments, RMG can involve the replacement of the SiGe with a metal material, which can offer improved electrical performance and scalability. The metal gates can provide electrostatic control of the channel region, reduce leakage currents, and improve the semiconductor device's performance. In some embodiments, the metal gates can further provide improved control over the work function, enable matching of threshold voltages, and reduce semiconductor device variability.

Figure 8:
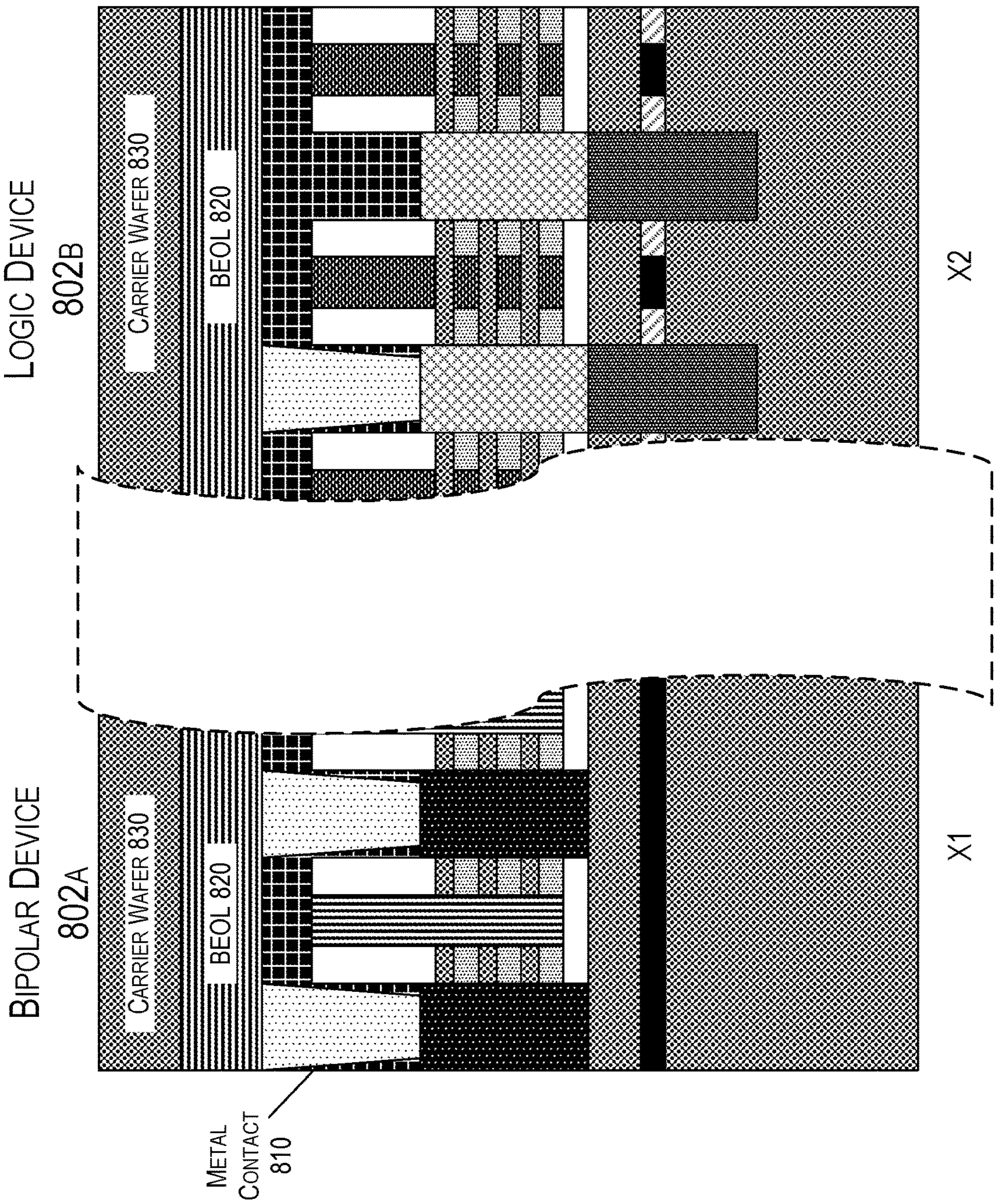
FIG. 8 illustrates the semiconductor device after the formation of the MOL, in accordance with some embodiments.

FIG. 8 illustrates a cross section view of a bipolar device 802A and a logic device 802B on a common wafer after the formation of the MOL, in accordance with some embodiments. In some embodiments, the MOL is performed. The formation of the MOL involves the formation of the metal contacts 810 and interconnects that connect various components to the BEOL 820 and the carrier wafer 830. In several embodiments, during the MOL process, multiple metal layers are deposited and patterned on the semiconductor device. These metal layers serve as electrical connections, allowing signals to pass between different parts of the integrated circuit. In addition to metal layers, insulating layers (often made of low-k dielectric materials) can be deposited between metal layers to isolate them from each other and prevent electrical interference. In some embodiments, advanced lithography and patterning techniques are used to define the intricate patterns of metal lines and vias (vertical connections between metal layers) during the MOL process. CMP can be performed to ensure a flat and smooth surface for subsequent metal layers. In an embodiment, barrier and liner layers are deposited before the metal layers to enhance adhesion, prevent metal diffusion, and improve overall performance. The BEOL 820 can include metal interconnects, e.g., wires and metal lines, and insulating layers that connect the various components of the semiconductor device and enable them to function as a cohesive unit.

In various embodiments, carrier wafer bonding, also known as wafer-to-wafer bonding or chip-to-wafer bonding, is performed to join two semiconductor devices together by creating a permanent bond between them. In some embodiments, the two semiconductor devices can be brought into contact and bonded at the atomic or molecular level, to create an interface. In an embodiment, the two semiconductor devices are brought into contact under controlled conditions, such as controlled pressure and temperature, to enable atomic or molecular bonding at the interface. Such bonding can be done at room temperature or with elevated temperatures. Alternatively, in some embodiments, an electric field and elevated temperature are utilized to create a bond. One semiconductor device can be made of semiconductor material, while the other can be a glass or silicon dioxide (SiO2) wafer. The electric field can cause ions in the glass or SiO2 to migrate and chemically bond with the semiconductor material in the other semiconductor device. In additional embodiments, a thin metal layer or metal alloy can be used as an intermediate bonding layer between the semiconductor devices. The metal layer can be deposited or transferred onto one or both semiconductor device surfaces, and the semiconductor devices can then be brought into contact and subjected to temperature and pressure to create a metallic bond.

Figure 9:
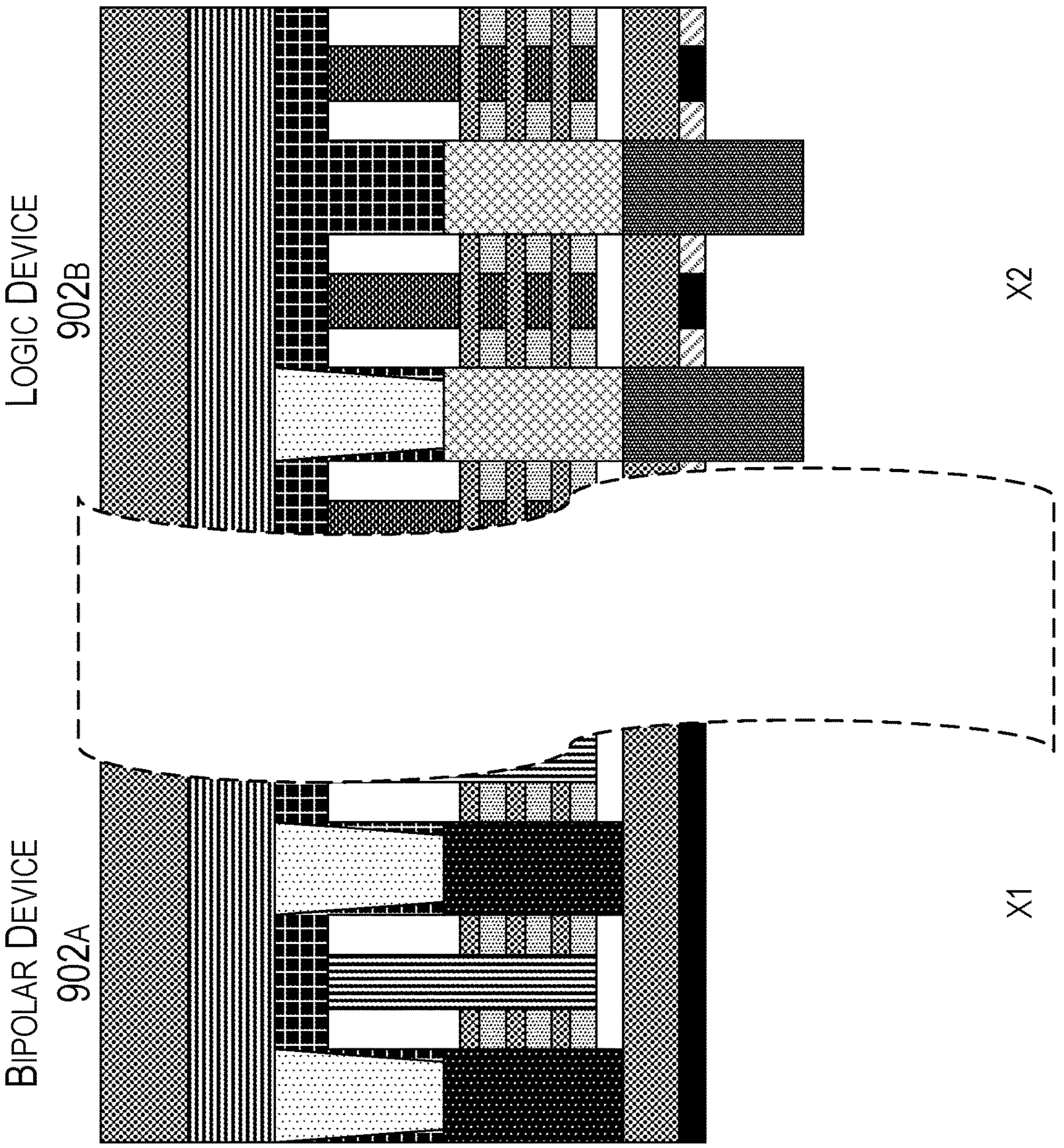
FIG. 9 illustrates the semiconductor device after the substrate removal, in accordance with some embodiments.

FIG. 9 illustrates a cross section view of a bipolar device 902A and a logic device 902B on a common wafer after the substrate removal, in accordance with some embodiments. In some embodiments, the wafer is flipped, and the first substrate is removed. It should be noted that, for the sake of simplicity, the semiconductor device is not shown as flipped.

Figure 10:
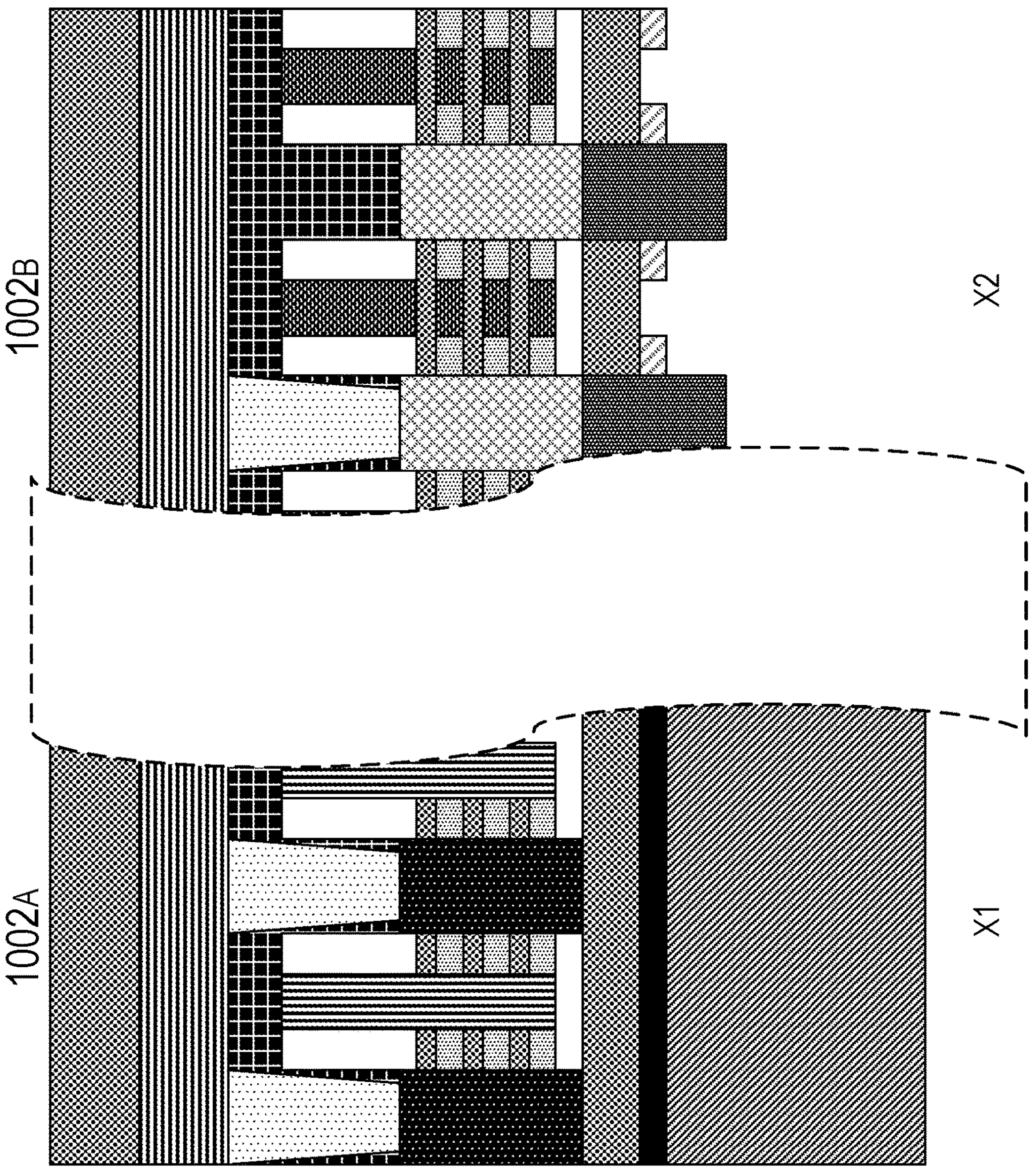
FIG. 10 illustrates the semiconductor device after the etching the etch stop layer, in accordance with some embodiments.

FIG. 10 illustrates a cross section view of a bipolar device 1002A and a logic device 1002B on a common wafer after the etching the etch stop layer, in accordance with some embodiments. In some embodiments, while the bipolar device is blocked, the etch stop layer in the logic device is directionally etched. In some embodiments, the etching is stopped at the N-well substrate.

Figure 11:
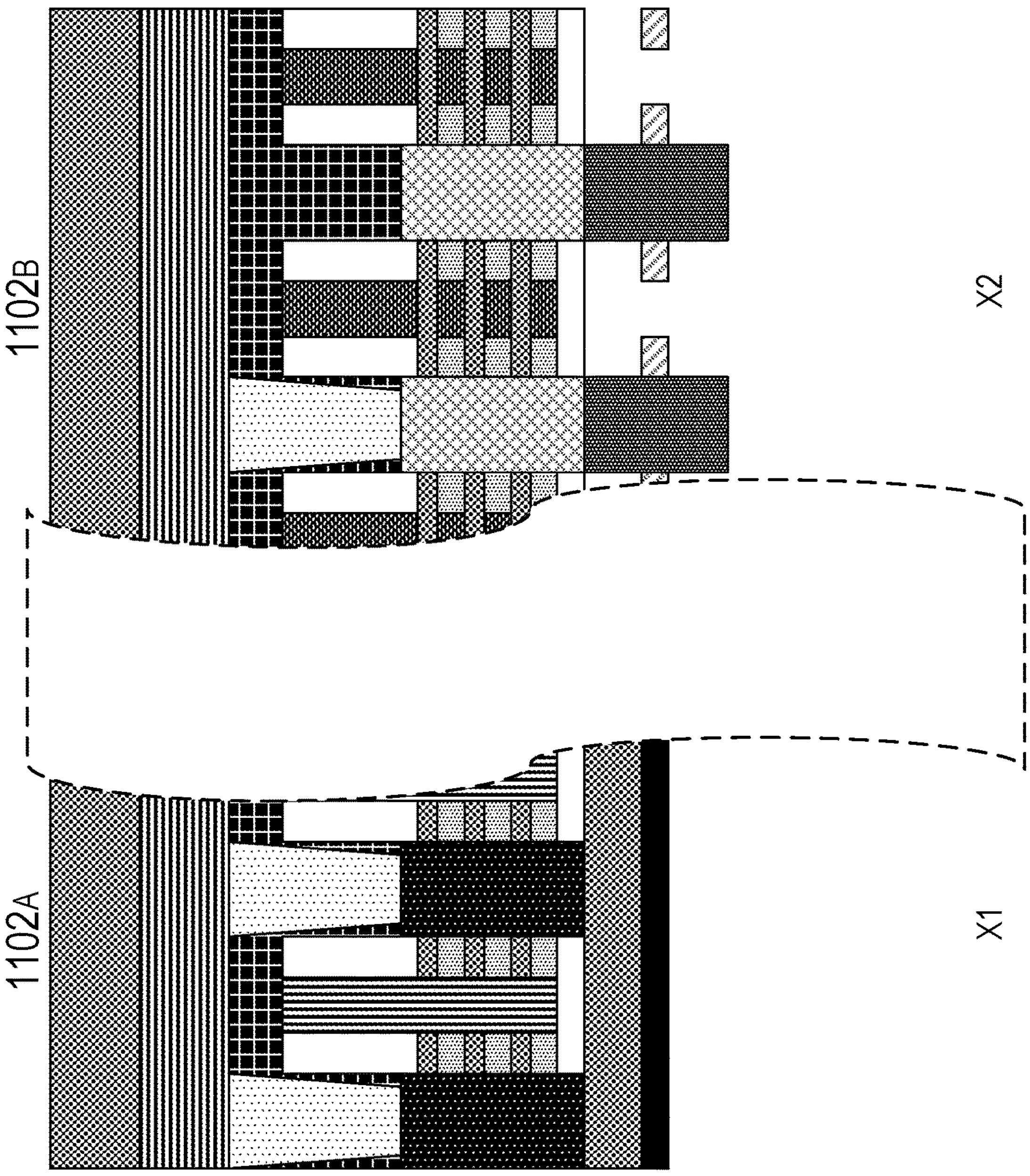
FIG. 11 illustrates the semiconductor device after the remaining substrate removal, in accordance with some embodiments.

FIG. 11 illustrates a cross section view of a bipolar device 1102A and a logic device 1102B on a common wafer after the remaining substrate removal, in accordance with some embodiments. In some embodiments, the OPL is removed, followed by the removal of the remaining silicon substrate in the logic device. It should be noted that, since the bipolar device is blocked, the etch stop layer in the bipolar device remains intact.

Figure 12:
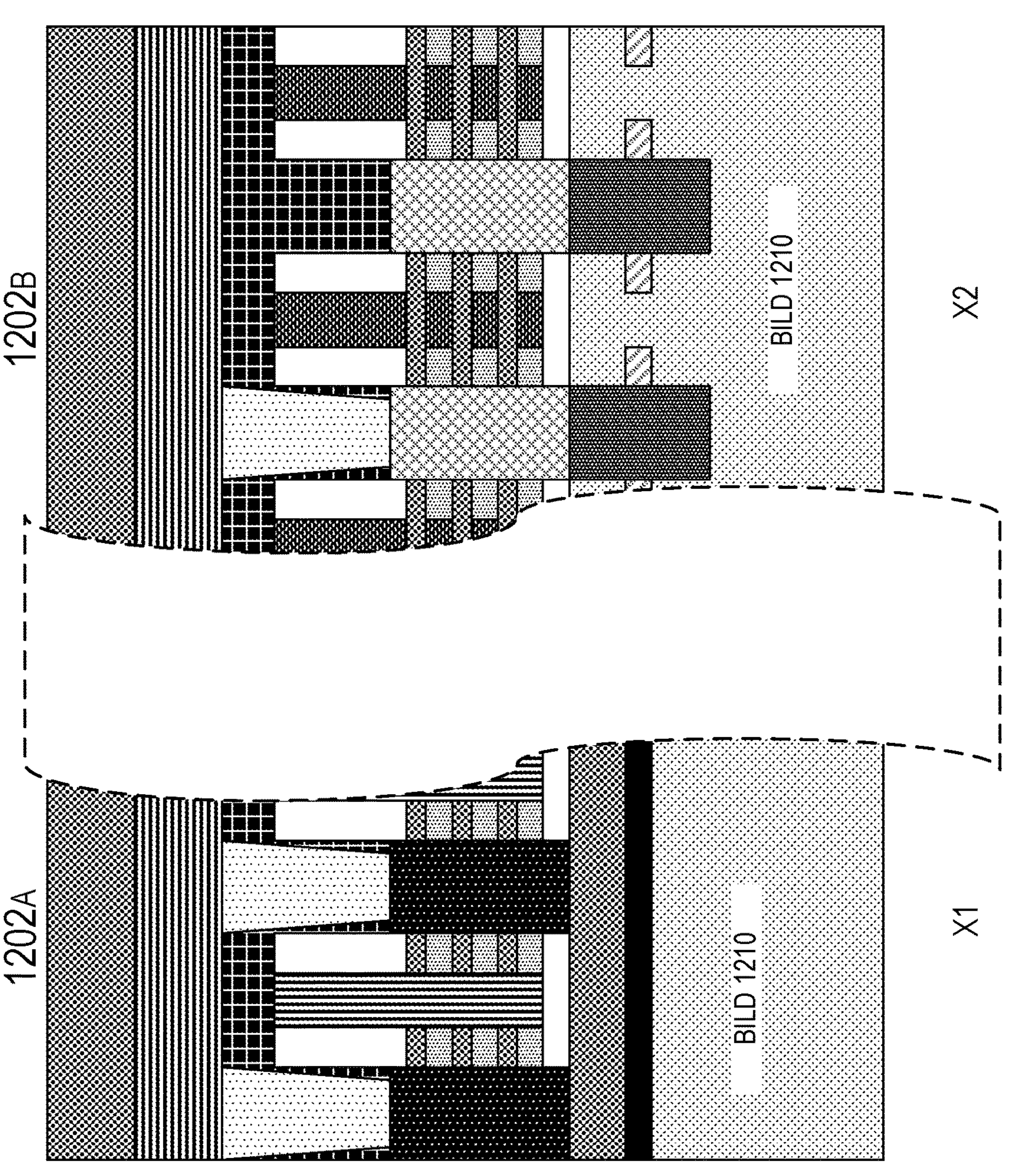
FIG. 12 illustrates the semiconductor device after the formation of the backside ILD, in accordance with some embodiments.

FIG. 12 illustrates a cross section view of a bipolar device 1202A and a logic device 1202B on a common wafer after the formation of the backside ILD, in accordance with some embodiments. In some embodiments, the backside ILD, BILD, 1210 is formed below the etch stop layer in the bipolar device, and the placeholder, the sacrificial layer, and the SASI in the logic device. The BILD 1210 can be an insulating material or layer used to isolate and provide electrical insulation between the semiconductor device's active regions and the placeholders. In various embodiments, the BILD 1210 can function as a protective layer, shielding the active regions of the semiconductor device from external contaminants, moisture, and mechanical stress. The BILD 1210 can further help prevent physical damage, such as scratches or particle contamination, which could adversely affect semiconductor device performance. Additionally, the BILD 1210 can function as a barrier against moisture ingress, which can cause corrosion and degradation of the semiconductor device's components.

Figure 13:
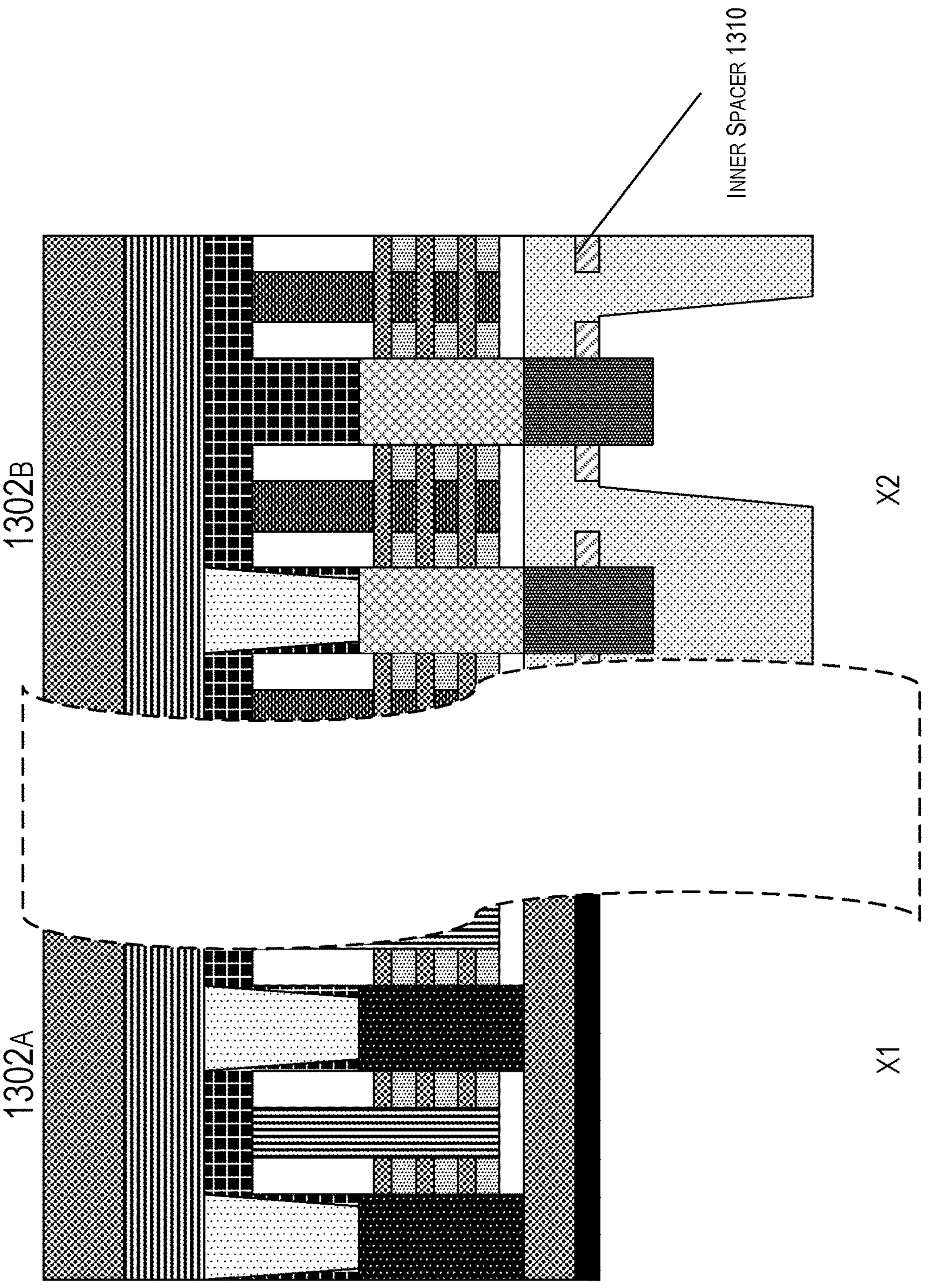
FIG. 13 illustrates the semiconductor device after the patterning of the backside contact, in accordance with some embodiments.

FIG. 13 illustrates a cross section view of a bipolar device 1302A and a logic device 1302B on a common wafer after the patterning of the backside contact, in accordance with some embodiments. In some embodiments, portions of the BILD are recessed to form a cavity for the formation of the backside contact in the logic device. The BILD in the bipolar device is completely removed. The removal of the BILD is stopped once portions of the inner spacer 1310 which are formed over the sidewalls of the sacrificial placeholder are exposed.

Figure 14:
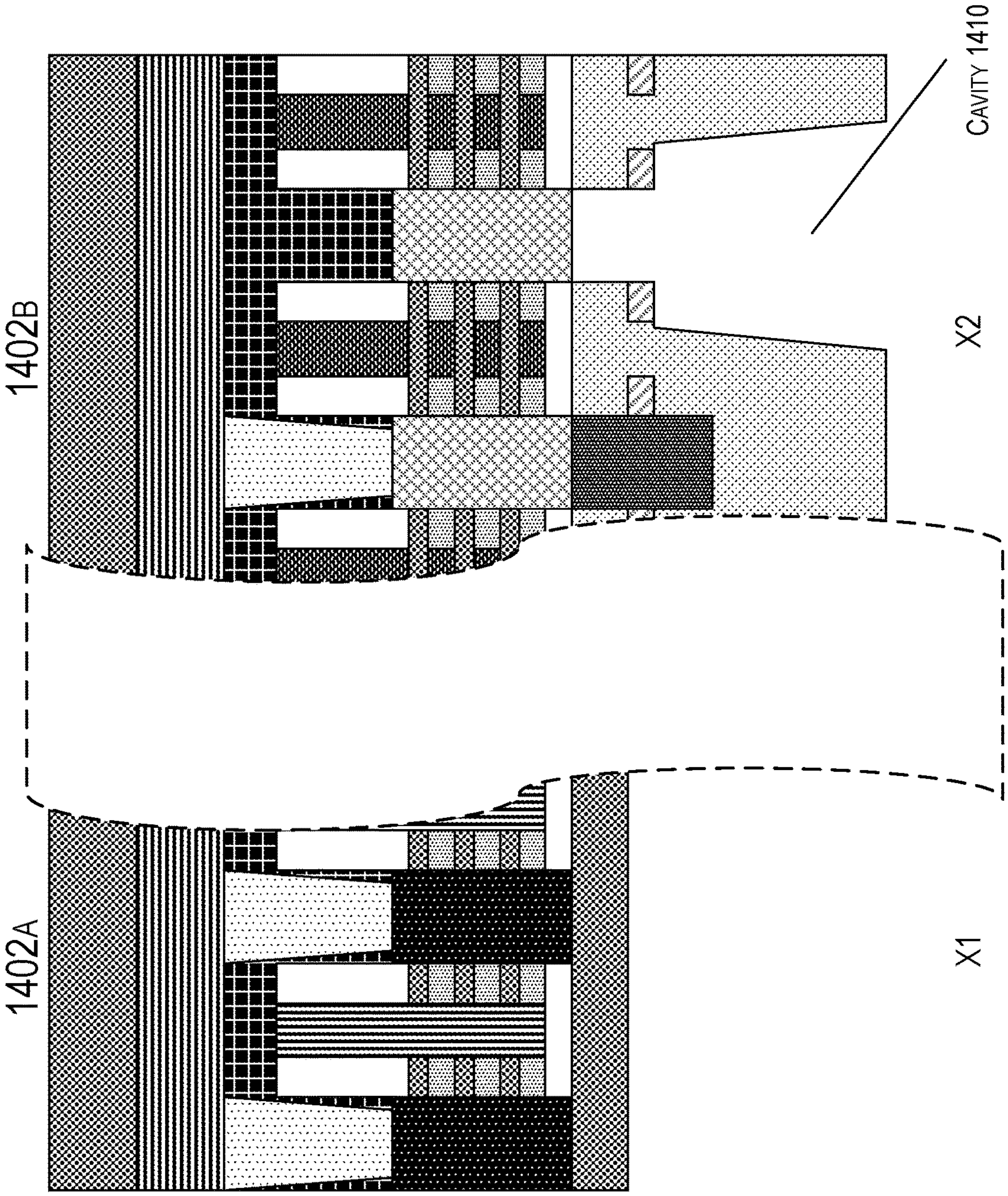
FIG. 14 illustrates the semiconductor device after the removal of the etch stop layer, in accordance with some embodiments.

FIG. 14 illustrates a cross section view of a bipolar device 1402A and a logic device 1402B on a common wafer after the removal of the SiGe, in accordance with some embodiments. In some embodiments, upon removing the BILD, the etch stop layer in the bipolar device is exposed. The exposed etch stop layer is removed to expose the N-well substrate in the bipolar device. In some embodiments, the sacrificial placeholder below the second source/drain region in the logic device is removed to form a cavity 1410 for formation of the BSCA.

Figure 15:
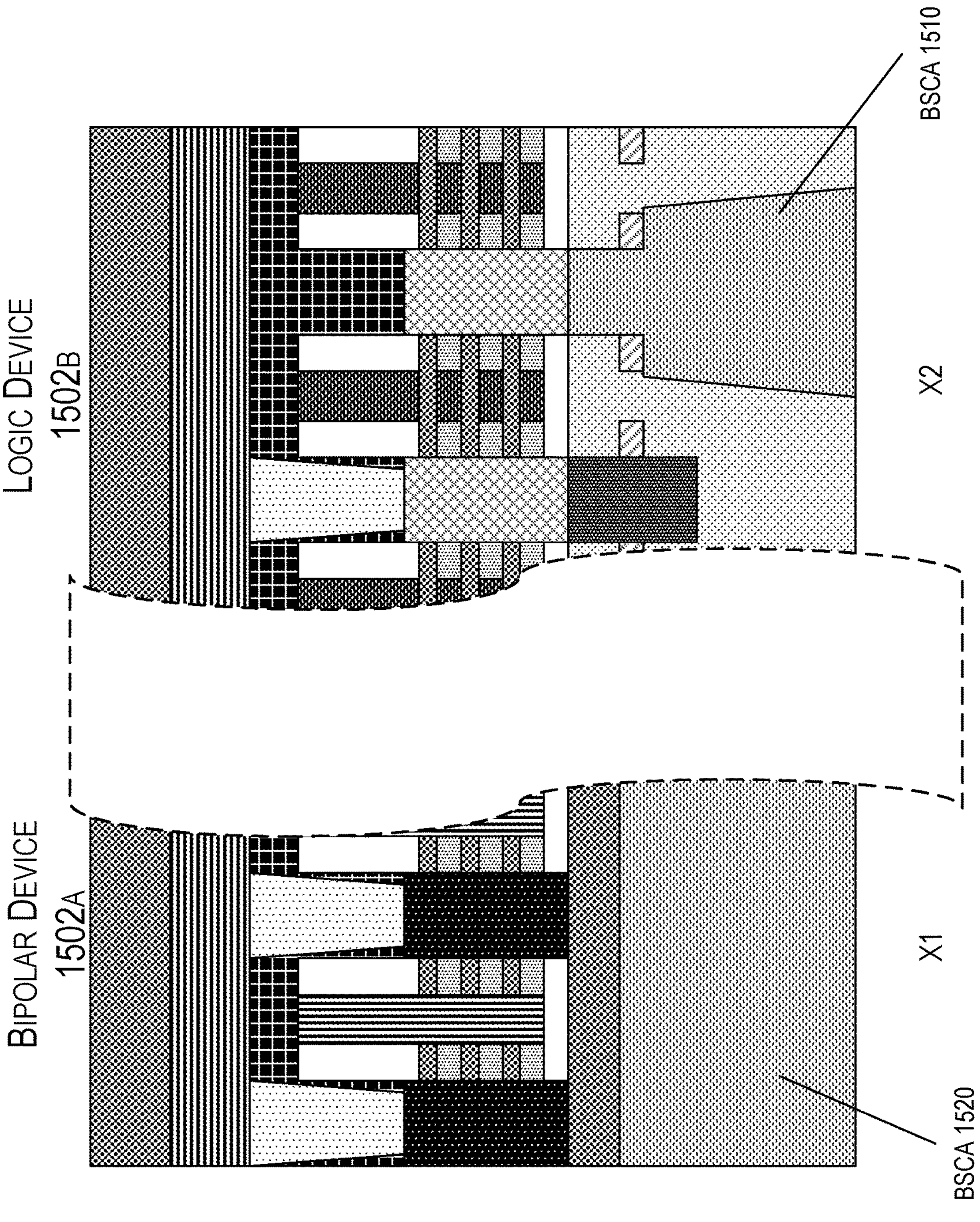
FIG. 15 illustrates the semiconductor device after the formation of the backside contact, in accordance with some embodiments.

FIG. 15 illustrates a cross section view of a bipolar device 1502A and a logic device 1502B on a common wafer after the formation of the backside contact, in accordance with some embodiments. In some embodiments, once the sacrificial placeholder is removed and the bottom of the third source/drain region is exposed, the BSCA 1510 is formed within the cavity by filling with a metal contact in the logic device. The BSCA 1510 is surrounded by the BILD. Similarly, the BSCA 1520 is formed in the bipolar device.

Figure 16:
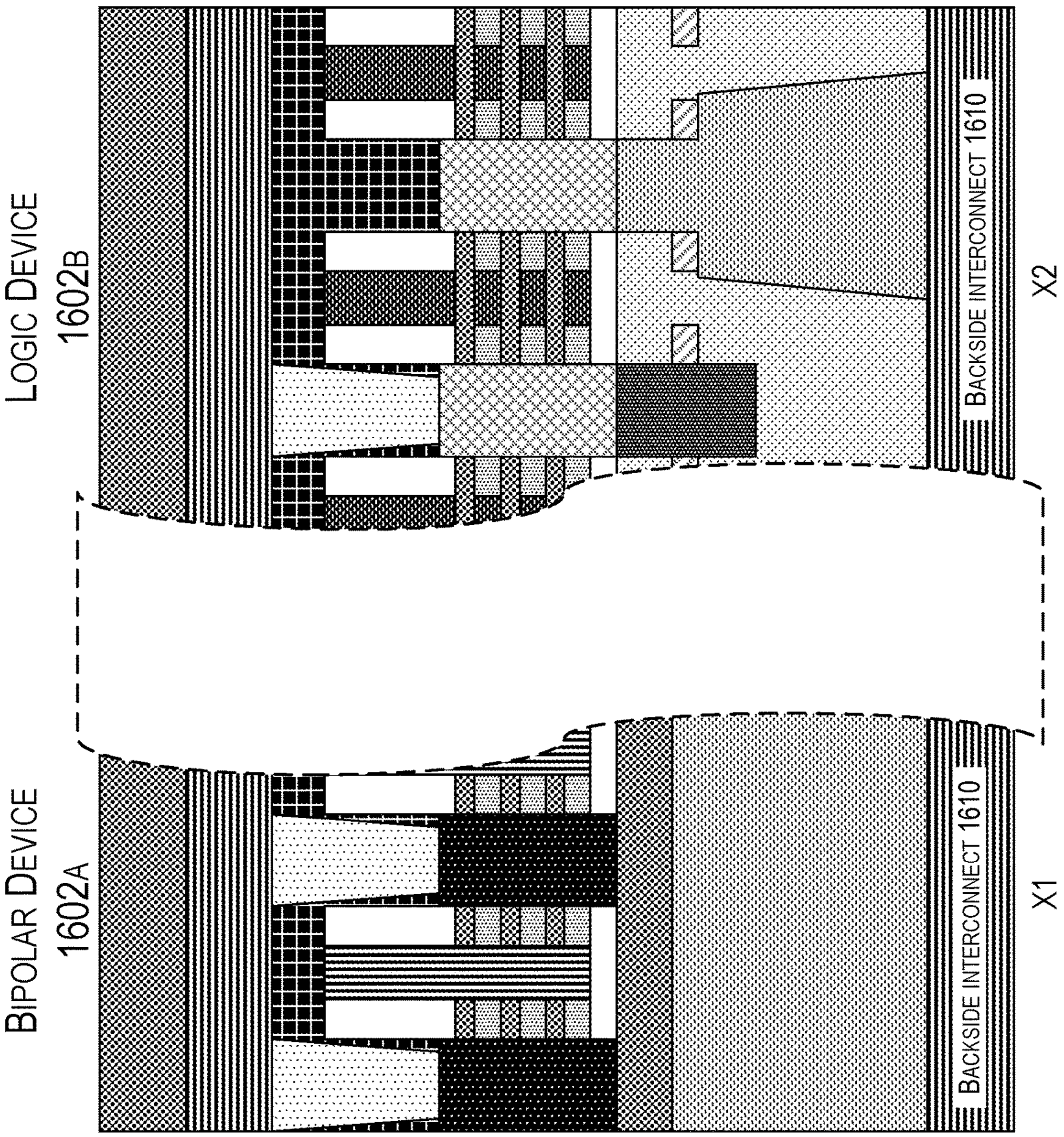
FIG. 16 illustrates the semiconductor device after the formation of backside interconnect, in accordance with some embodiments.

FIG. 16 illustrates a cross section view of a bipolar device 1602A and a logic device 1602B on a common wafer after the formation of backside interconnect, in accordance with some embodiments. A backside interconnect 1610 is formed to cover the BSCA and the BILD. The backside interconnect 1610 can be used to connect the semiconductor device to other devices via the BSCA.

Figure 17:
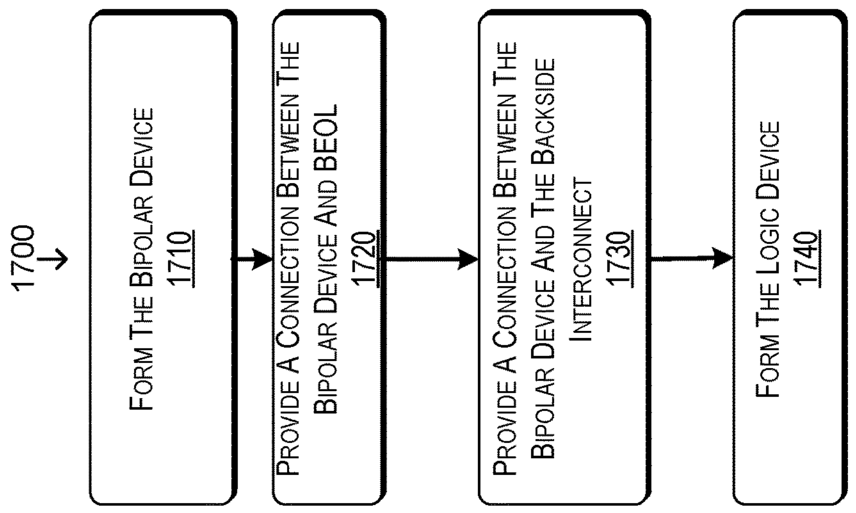
FIG. 17 illustrates block diagrams of a method for forming the semiconductor device, in accordance with some embodiments.

FIG. 17 illustrates block diagrams of a method 1700 for forming the semiconductor device, in accordance with some embodiments. As shown by block 1710, a bipolar device is formed.

As shown by block 1720, a connection between a frontside of the bipolar device to a back end of line (BEOL) is provided.

As shown by block 1730, a connection between a backside of the bipolar device to a backside interconnect is provided.

As shown by block 1740, a logic device is formed.

In one aspect, the method and structures described above may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip may be mounted in a single chip package (such as a plastic carrier, with leads that are affixed to a motherboard or other higher-level carrier) or in a multichip package (such as a ceramic carrier that has either or both surface interconnections or buried interconnections). In any case, the chip can then be integrated with other chips, discrete circuit elements, and/or other signal processing devices as part of either (a) an intermediate product, such as a motherboard, or (b) an end product. The end product can be any product that includes integrated circuit chips, ranging from low-end applications, such as toys, to advanced computer products having a display, a keyboard or other input device, and a central processor.

CONCLUSION

The descriptions of the various embodiments of the present teachings have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications, and variations that fall within the true scope of the present teachings.

The components, steps, features, objects, benefits, and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits and advantages. These also include embodiments in which the components and/or steps are arranged and/or ordered differently.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments have more features than are expressly recited in each claim. Rather, as the following claims reflect, the inventive subject matter lies in less than all features of a single disclosed embodiment. Thus, the following claims are hereby incorporated into the Detailed Description, with each claim standing on its own as a separately claimed subject matter.

What is claimed is:

1. A semiconductor device, comprising:

a bipolar device comprising a diffusion break between two adjacent source/drain regions and having a frontside that is connected to a back end of line (BEOL), and a backside that is connected to a backside interconnect, wherein one of the adjacent source/drain regions is an emitter of the bipolar device and the other of the adjacent source/drain regions is a collector of the bipolar device; and a logic device adjacent the bipolar device.

2. The semiconductor device of claim 1, wherein the backside of the bipolar device is connected to the backside interconnect via a backside contact (BSCA) and a substrate.

3. The semiconductor device of claim 1, wherein the frontside of the bipolar device is connected to the BEOL via the two adjacent source/drain regions and a middle of line (MOL) contact.

4. The semiconductor device of claim 3, wherein:

the bipolar device further comprises a substrate; and the two adjacent source/drain regions are both P-doped and the substrate is N-doped.

5. The semiconductor device of claim 3, wherein:

the bipolar device further comprises a substrate;

the two adjacent source/drain regions are both N-doped; and the substrate is P-doped.

6. The semiconductor device of claim 1, wherein a bottom of the diffusion break is isolated from a substrate by a self-aligned substrate isolation (SASI).

7. The semiconductor device of claim 1, wherein the logic device includes a plurality of field-effect transistors (FETs).

8. The semiconductor device of claim 7, wherein a first source/drain region in a first FET in the logic device is connected to the backside interconnect via a backside contact (BSCA).

9. The semiconductor device of claim 8, wherein the BSCA in the logic device includes a self-aligned portion and a non-self-aligned portion.

10. The semiconductor device of claim 9, further comprising a layer of first inner spacer over portions of sidewalls of the self-aligned portion of the BSCA.

11. The semiconductor device of claim 7, wherein a second source/drain region in a second FET in the logic device is connected to the BEOL via a MOL contact.

12. The semiconductor device of claim 11, further comprising:

a placeholder in the logic device connected to the second source/drain region; and a layer of an inner spacer over portions of sidewalls of the placeholder.

13. A method for forming a semiconductor device, the method comprising:

forming a bipolar device, providing a connection between a frontside of the bipolar device to a back end of line (BEOL);

providing a connection between a backside of the bipolar device to a backside interconnect;

forming a logic device adjacent the bipolar device;

providing a connection between the backside of the bipolar device to the backside interconnect via a backside contact (BSCA) and a substrate;

forming a diffusion break between two adjacent source/drain regions in the bipolar device; and isolating a bottom of the diffusion break from the substrate by a self-aligned substrate isolation (SASI).

14. The method of claim 13, further comprising: providing a connection between the frontside of the bipolar device to the BEOL via a plurality of source/drain regions and a middle of line (MOL) contact.

15. The method of claim 13, further comprising providing a connection between a source/drain region in the logic device and the backside interconnect via the BSCA.

16. The method of claim 13, further comprising:

forming a placeholder in the logic device, wherein the placeholder is connected to a source/drain region; and forming a layer of inner spacer over portions of sidewalls of the placeholder.

17. The method of claim 13, further comprising providing a connection between a source/drain region in the logic device and the BEOL via a MOL contact.

18. A semiconductor device, comprising:

a bipolar device comprising a diffusion break between two adjacent source/drain regions and having a backside that is connected to a backside interconnect, wherein one of adjacent source/drain regions is an emitter of the bipolar device and the other of the adjacent source/drain regions is a collector of the bipolar device;

a logic device adjacent the bipolar device;

a backside contact (BSCA) in the logic device, having a self-aligned section and a non-self-aligned section; and a layer of inner spacer over sidewalls of the self-aligned section of the BSCA.

* * * * *